(12) United States Patent
Ellinger et al.

(10) Patent No.: US 8,791,023 B2
(45) Date of Patent: *Jul. 29, 2014

(54) PATTERNED THIN FILM DIELECTRIC LAYER FORMATION

(75) Inventors: Carolyn R. Ellinger, Rochester, NY (US); David H. Levy, Rochester, NY (US); Shelby F. Nelson, Pittsford, NY (US)

(73) Assignee: Eastman Kodak Company, Rochester, NY (US)

(*) Notice: Subject to any disclaimer, the term of this patent is extended or adjusted under 35 U.S.C. 154(b) by 3 days.

This patent is subject to a terminal disclaimer.

(21) Appl. No.: 13/600,287

(22) Filed: Aug. 31, 2012

(65) Prior Publication Data

US 2014/0065831 A1   Mar. 6, 2014

(51) Int. Cl.
 *H01L 21/311*   (2006.01)

(52) U.S. Cl.
 USPC ........... 438/703; 438/591; 438/479; 438/216; 257/E31.119; 257/E21.09; 257/E21.033; 257/632; 257/646; 257/E21.25; 257/E21.292; 257/E21.493; 257/E31.004

(58) Field of Classification Search
 CPC ............ H01L 21/02365; H01L 27/286; H01L 51/0525; H01L 29/4908; H01L 29/66742; H01L 29/7869
 USPC ........ 438/703, 479, 478; 430/324; 427/248.1, 427/255.28, 255.395, 292, 309, 341–343, 427/376.1, 383.3, 397.7, 255.7; 257/E31.119, E21.033, E21.25, 257/E21.267, E21.292, E21.493, E51.015, 257/E31.004, E21.09
 See application file for complete search history.

(56) References Cited

U.S. PATENT DOCUMENTS

| | | | |
|---|---|---|---|
| 5,319,479 A * | 6/1994 | Yamada et al. | 349/138 |
| 6,121,098 A * | 9/2000 | Strobl | 438/301 |
| 7,160,819 B2 | 1/2007 | Conley, Jr. et al. | |
| 7,413,982 B2 | 8/2008 | Levy | |
| 7,456,429 B2 | 11/2008 | Levy | |
| 7,572,686 B2 | 8/2009 | Levy et al. | |
| 7,789,961 B2 | 9/2010 | Nelson et al. | |
| 7,846,644 B2 * | 12/2010 | Irving et al. | 430/313 |
| 7,998,878 B2 * | 8/2011 | Levy et al. | 438/765 |
| 8,017,183 B2 * | 9/2011 | Yang et al. | 427/248.1 |

(Continued)

FOREIGN PATENT DOCUMENTS

WO    WO 2008/082472    7/2008

OTHER PUBLICATIONS

Suntola, T., *Handbook of Thin Film Process Technology*, vol. 1, edited by Glocker et al., Institute of Physics (IOP) Publishing, Philadelphia 1995, pp. B1.5:1 to B1.5:16.

(Continued)

*Primary Examiner* — Jarrett Stark
*Assistant Examiner* — Bitew Dinke
(74) *Attorney, Agent, or Firm* — William R. Zimmerli

(57) ABSTRACT

A method of producing an inorganic thin film dielectric material layer includes providing a substrate. A first inorganic thin film dielectric material layer is deposited on the substrate using an atomic layer deposition process. The first inorganic thin film dielectric material layer is treated after its deposition. A patterned deposition inhibiting material layer is provided on the substrate. A second inorganic thin film dielectric material layer is selectively deposited on a region of the substrate where the deposition inhibiting material layer is not present using an atomic layer deposition process.

11 Claims, 19 Drawing Sheets

(56) References Cited

U.S. PATENT DOCUMENTS

| | | | |
|---|---|---|---|
| 8,129,098 B2* | 3/2012 | Irving et al. | 430/324 |
| 2002/0132401 A1* | 9/2002 | Powell | 438/161 |
| 2005/0158590 A1* | 7/2005 | Li | 428/698 |
| 2006/0102968 A1* | 5/2006 | Bojarczuk et al. | 257/392 |
| 2007/0229945 A1* | 10/2007 | Shibuya | 359/359 |
| 2008/0166880 A1 | 7/2008 | Levy | |
| 2008/0246089 A1* | 10/2008 | Ko et al. | 257/347 |
| 2009/0035946 A1* | 2/2009 | Pierreux et al. | 438/763 |
| 2009/0051749 A1 | 2/2009 | Baker | |
| 2009/0078204 A1 | 3/2009 | Kerr et al. | |
| 2009/0081366 A1 | 3/2009 | Kerr et al. | |
| 2009/0128936 A1* | 5/2009 | Shibuya | 359/885 |
| 2009/0130858 A1 | 5/2009 | Levy | |
| 2009/0311867 A1* | 12/2009 | Sandhu | 438/696 |
| 2010/0151150 A1* | 6/2010 | Kokaze et al. | 427/576 |
| 2010/0279514 A1* | 11/2010 | Herman et al. | 438/761 |
| 2011/0085233 A1* | 4/2011 | Furusato | 359/359 |
| 2012/0302003 A1* | 11/2012 | Shieh et al. | 438/104 |
| 2014/0065803 A1* | 3/2014 | Ellinger et al. | 438/479 |

OTHER PUBLICATIONS

Ritala, M. et al., *Handbook of Thin Film Materials*, vol. 1, edited by Nalwa, pp. 103-159.

Sinha, A. et al., *Journal of Science and Technology B*, vol. 24, No. 6, Nov./Dec. 2006, pp. 2523-2532.

* cited by examiner

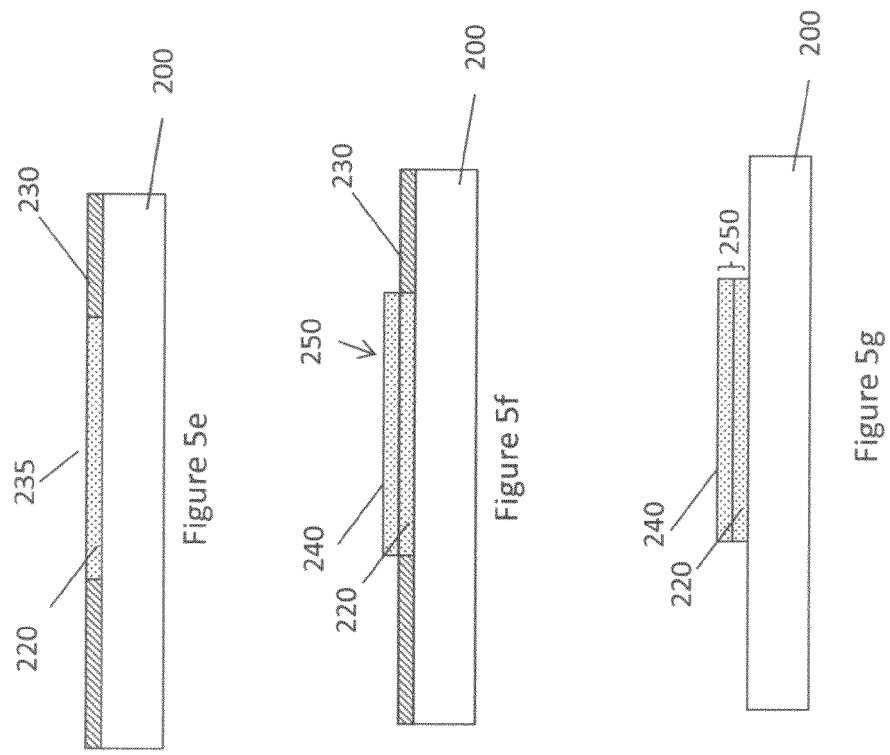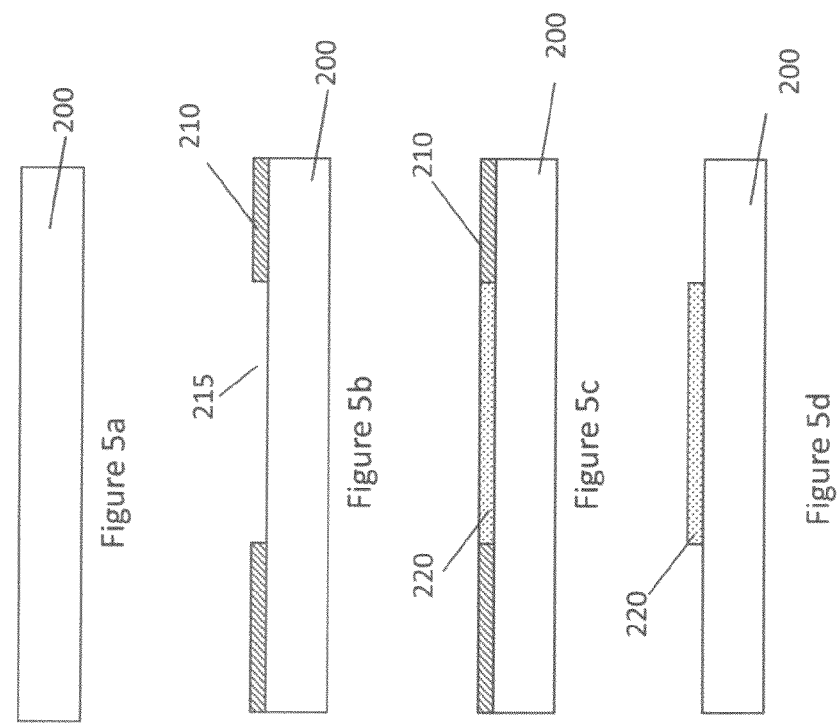

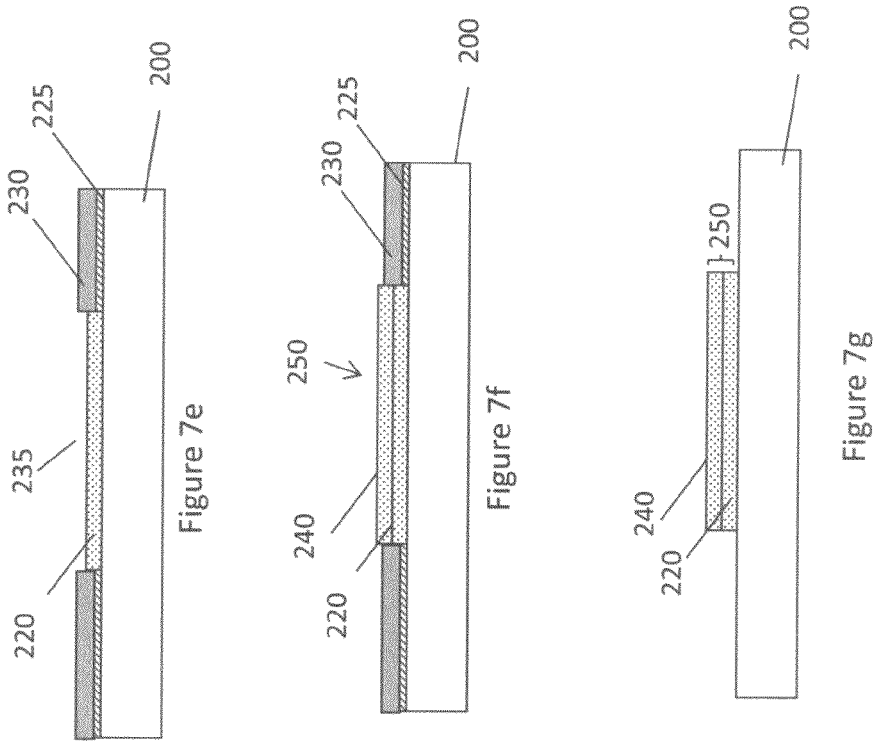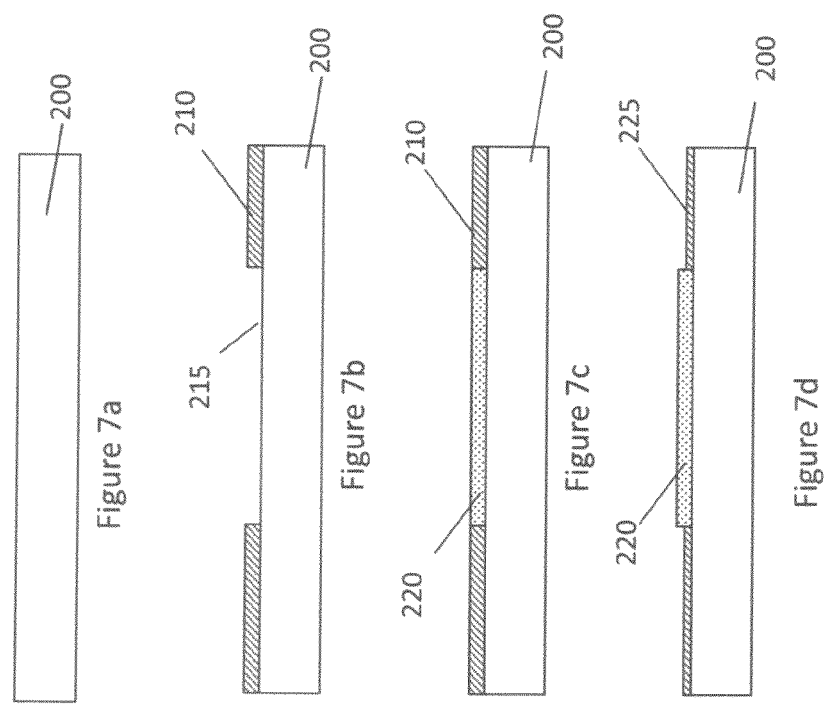

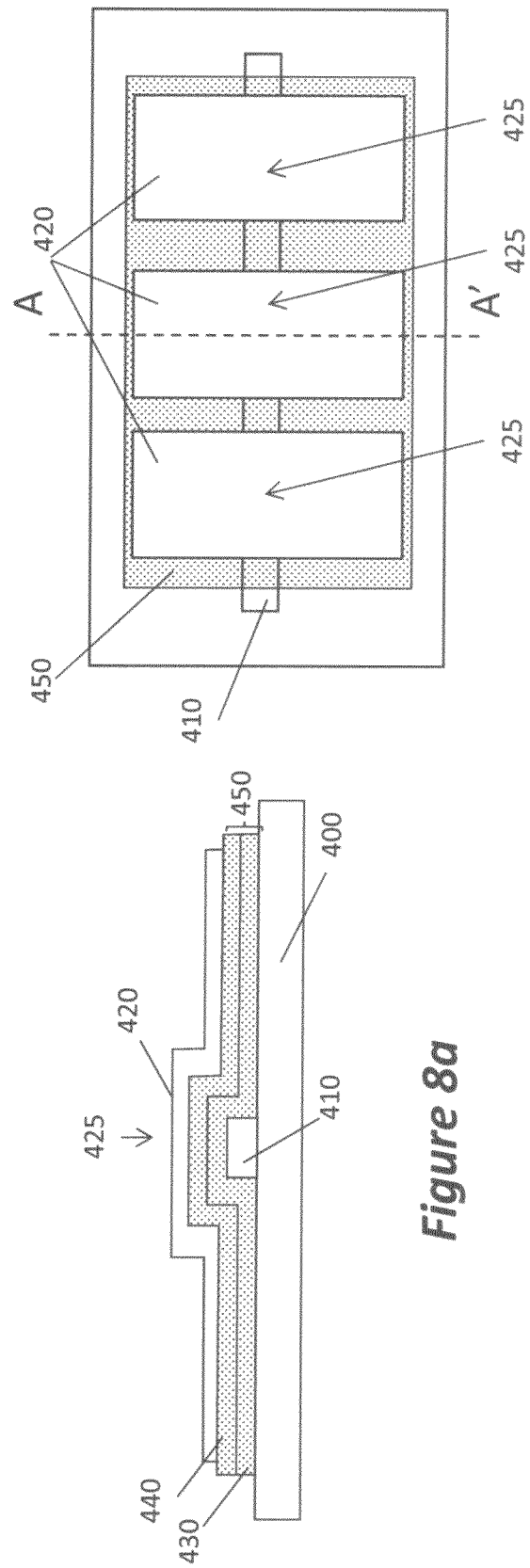

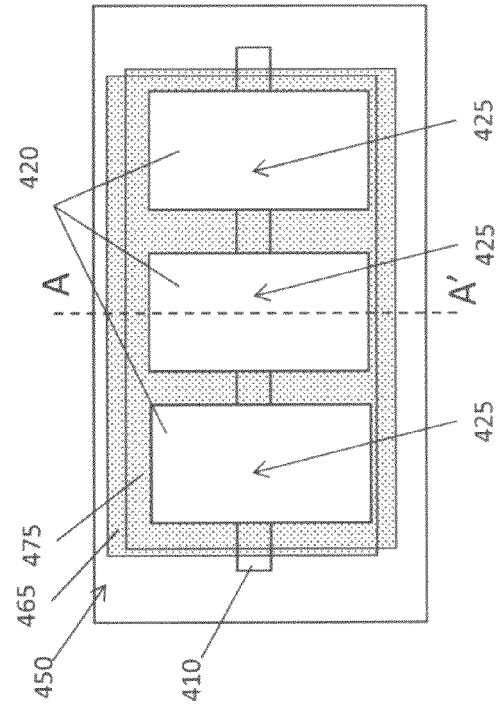
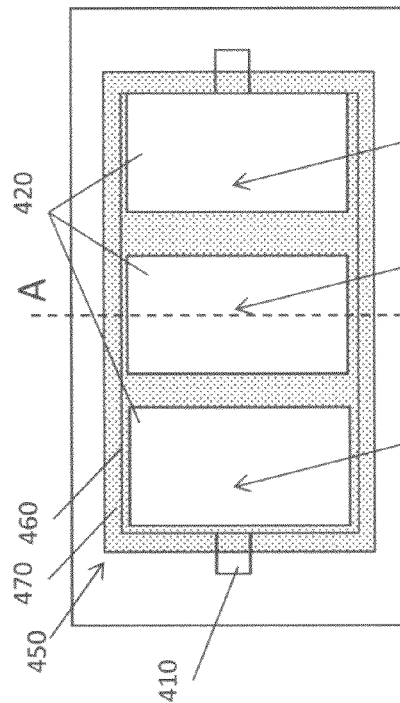
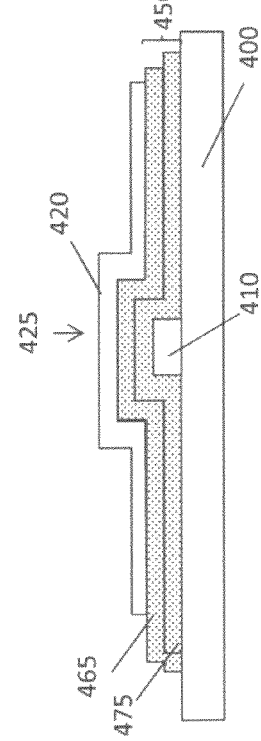
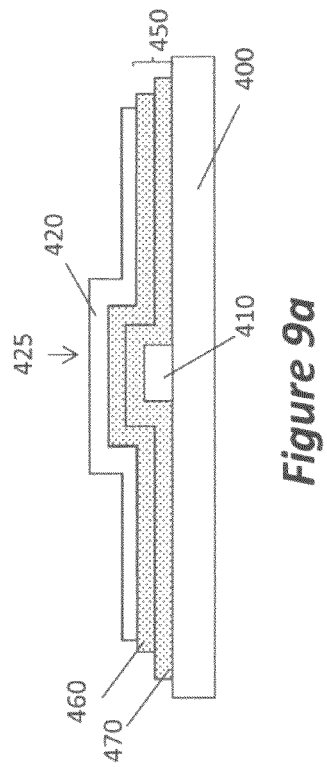
Figure 9a
Figure 9b
Figure 10a
Figure 10b

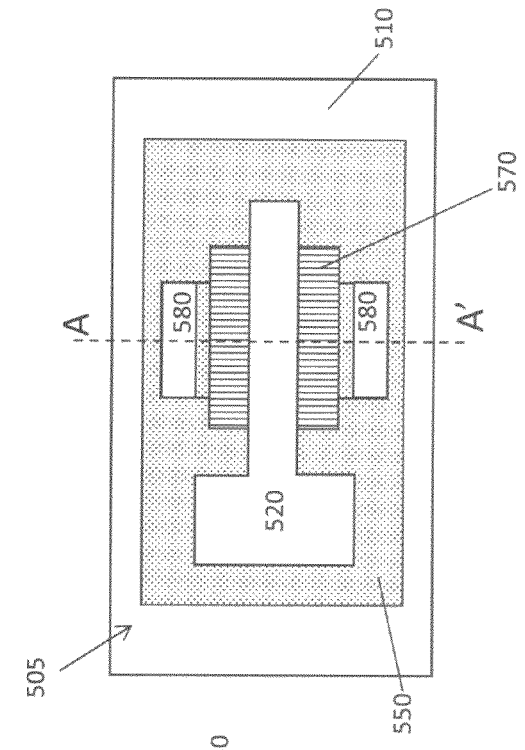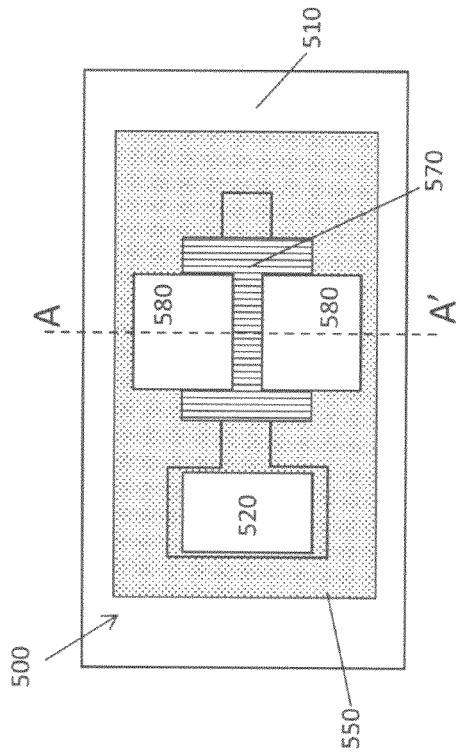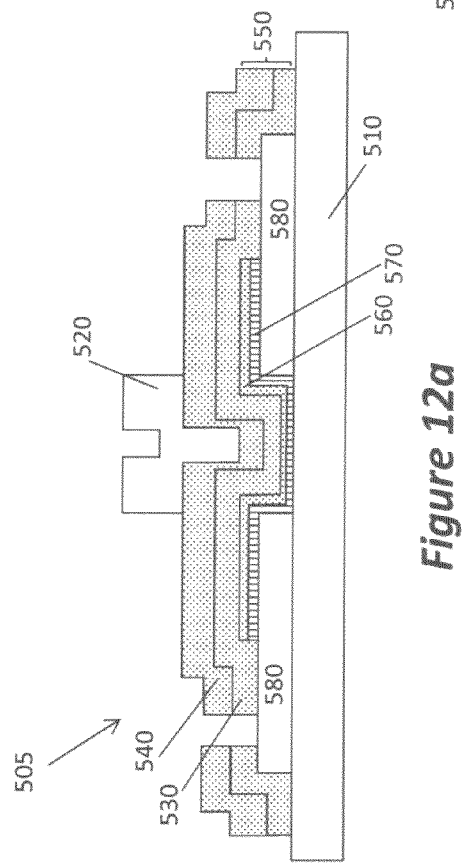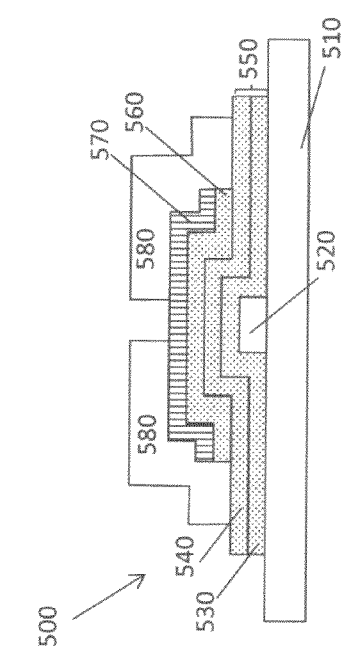
*Figure 11b*
*Figure 12b*
*Figure 11a*
*Figure 12a*

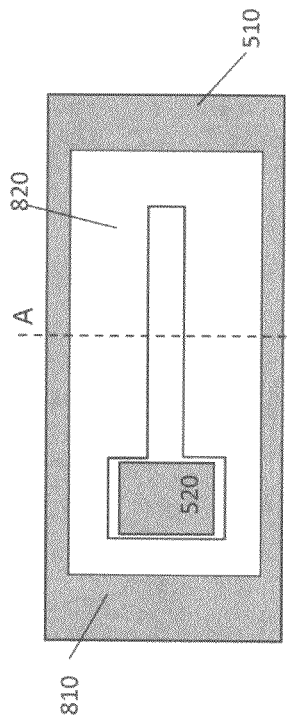
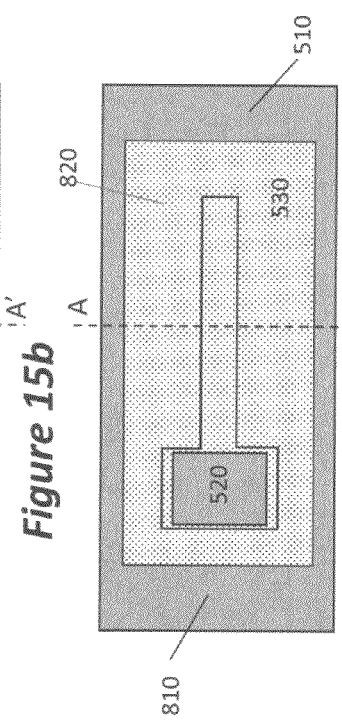
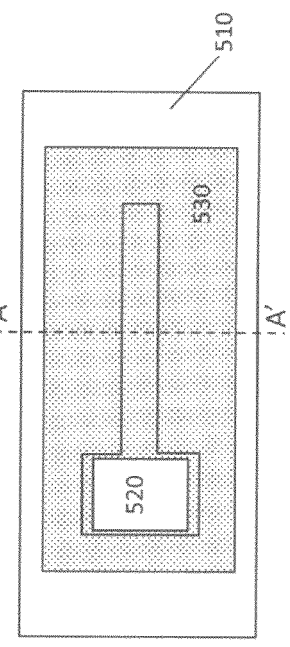
*Figure 15b*
*Figure 16b*
*Figure 17b*
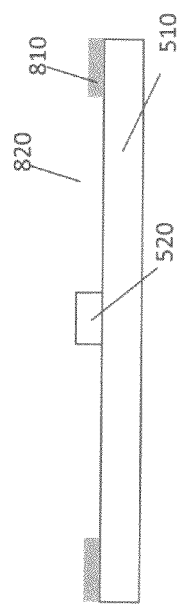
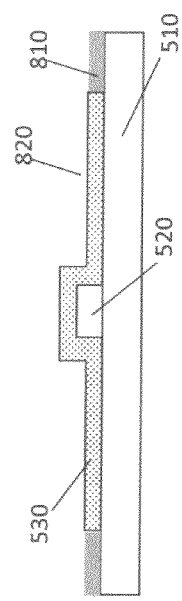
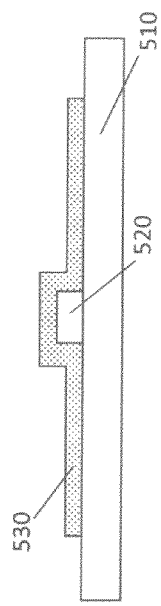
*Figure 15a*
*Figure 16a*
*Figure 17a*

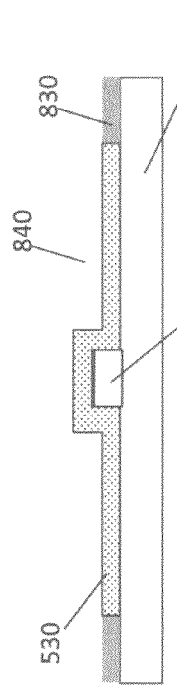
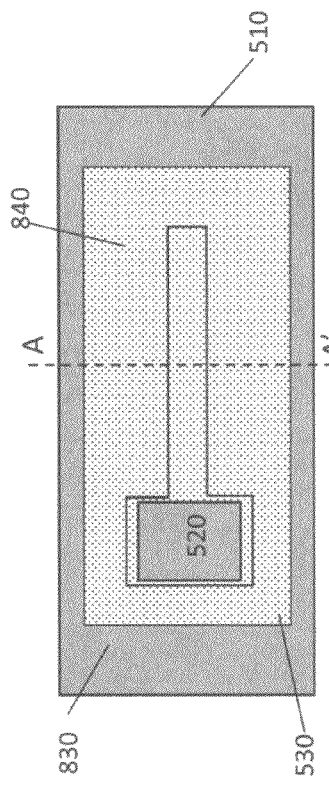
*Figure 18a*
*Figure 18b*
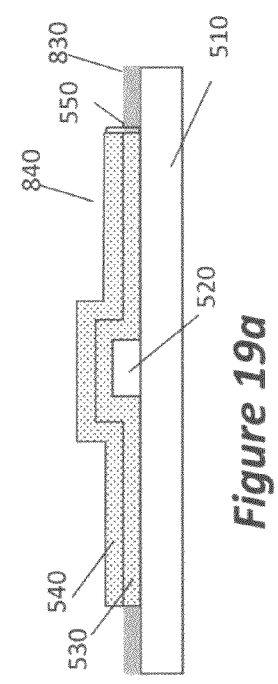
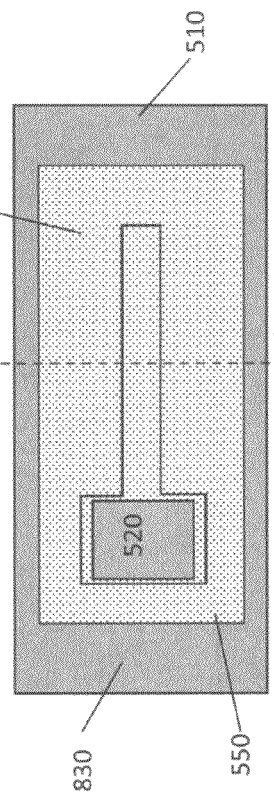
*Figure 19a*
*Figure 19b*
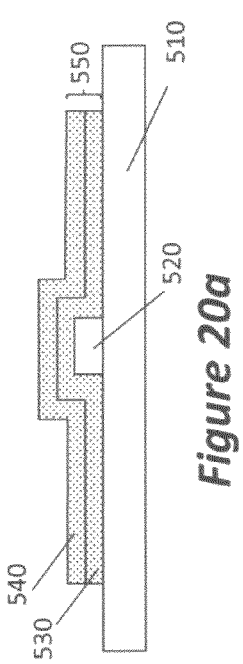
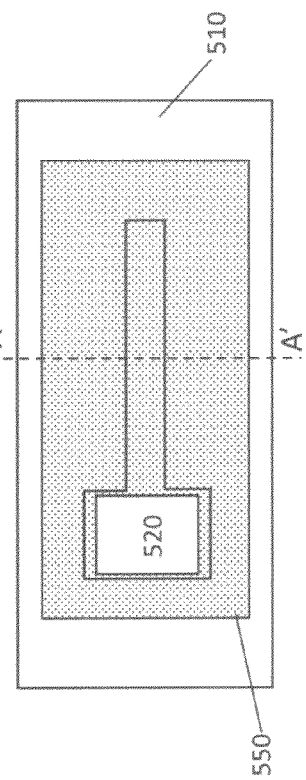
*Figure 20a*
*Figure 20b*

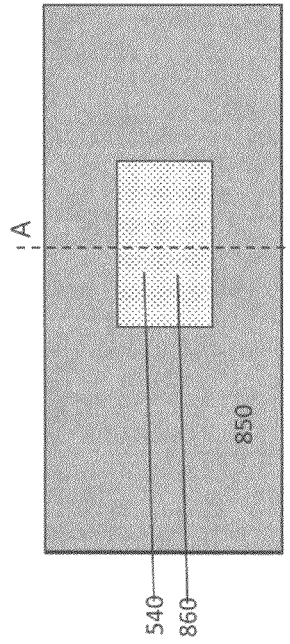
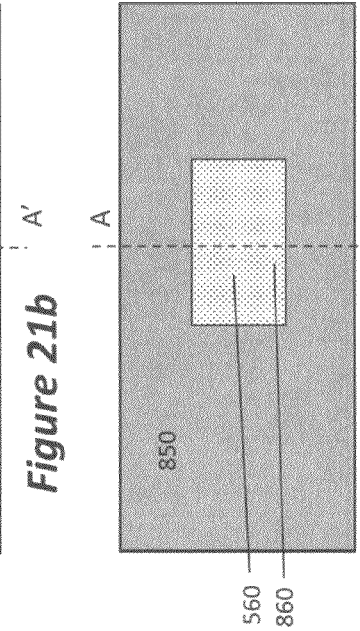
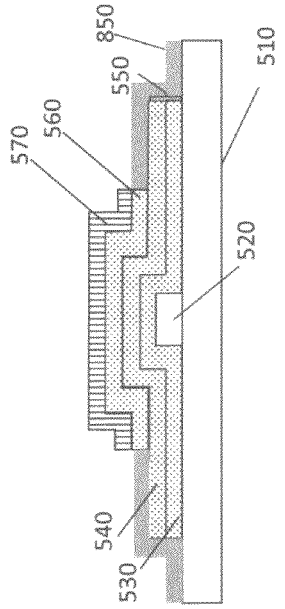
*Figure 21b*
*Figure 22b*
*Figure 23b*
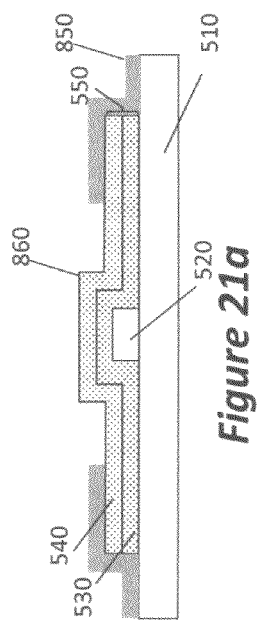
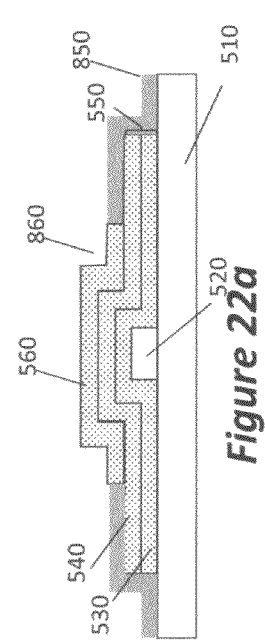
*Figure 21a*
*Figure 22a*
*Figure 23a*

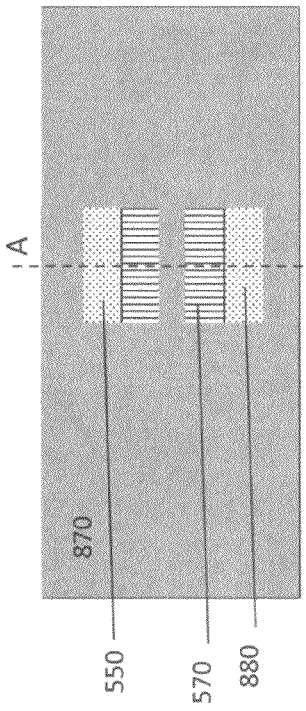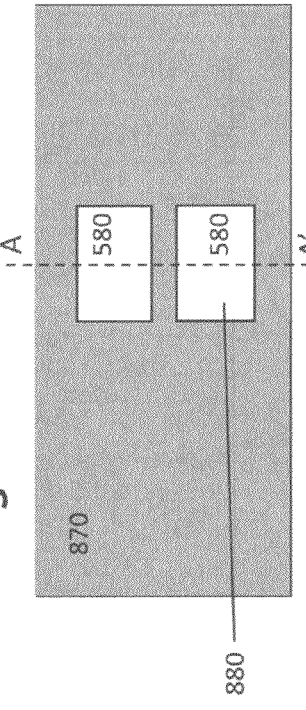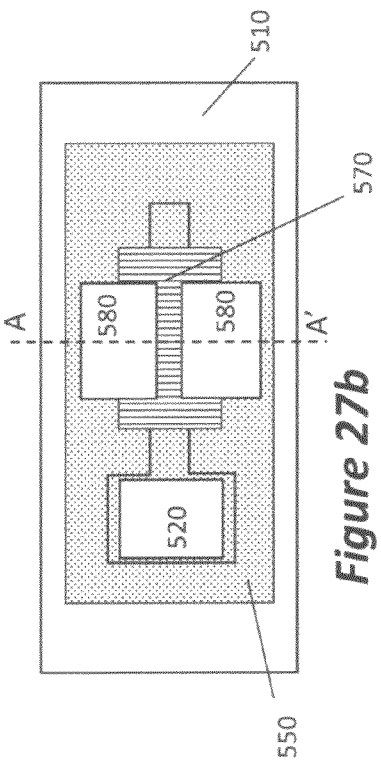
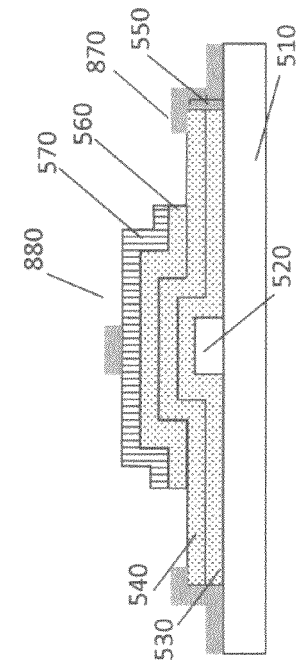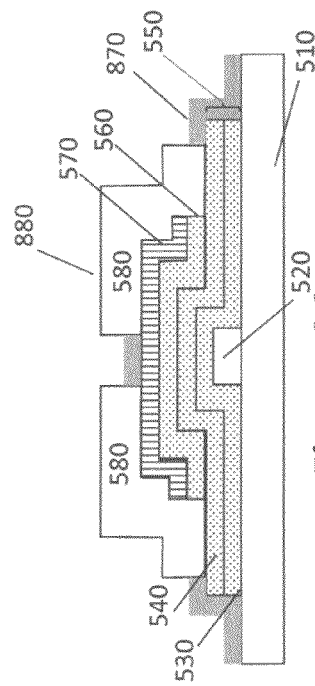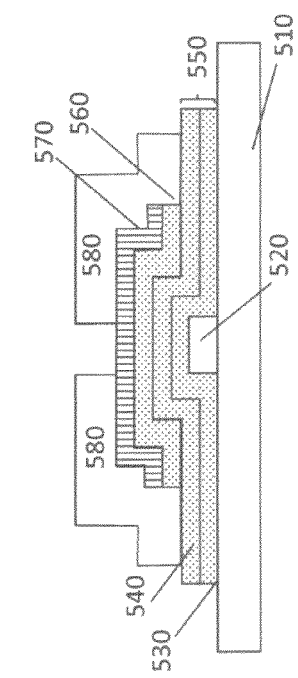

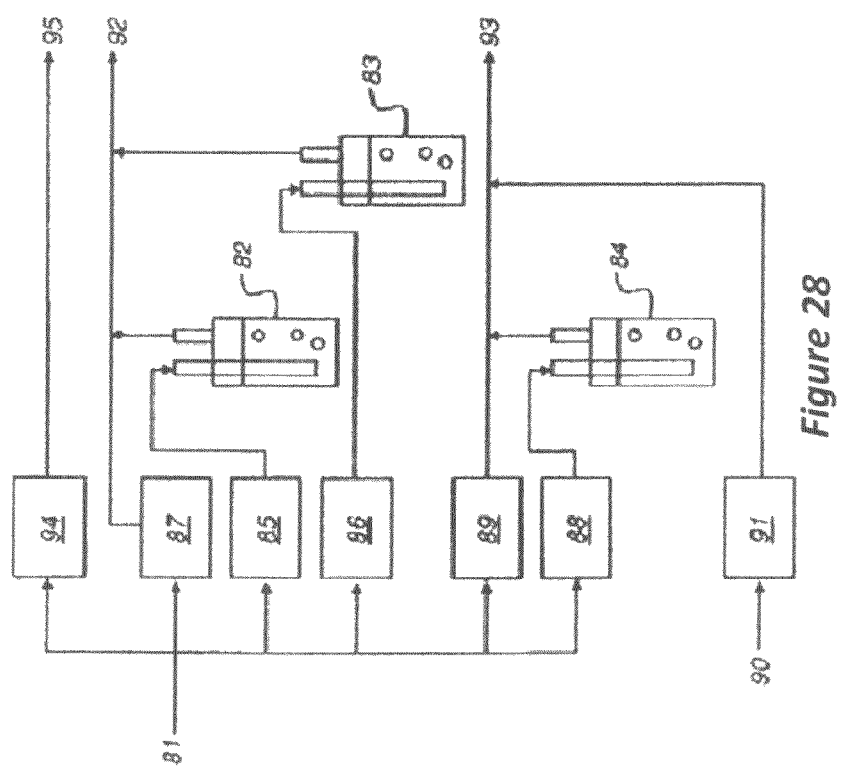

PATTERNED THIN FILM DIELECTRIC LAYER FORMATION

CROSS-REFERENCE TO RELATED APPLICATIONS

Reference is made to commonly-assigned, U.S. patent application Ser. No. 13/600,264, entitled "THIN FILM DIELECTRIC LAYER FORMATION" and Ser. No. 13/600,274, entitled "PATTERNED THIN FILM DIELECTRIC STACK FORMATION", all filed concurrently herewith.

FIELD OF THE INVENTION

This invention relates generally to patterned thin film fabrication and electronic and optoelectronic devices including patterned thin films. In particular, this invention relates to selective area deposition of materials including, for example, metal-oxides, and devices including, for example, thin film transistors and photovoltaics, produced using this fabrication technique.

BACKGROUND OF THE INVENTION

Modern-day electronics require multiple patterned layers of electrically or optically active materials, sometimes over a relatively large substrate. Electronics such as radio frequency identification (RFID) tags, photovoltaics, optical and chemical sensors all require some level of patterning in their electronic circuitry. Flat panel displays, such as liquid crystal displays or electroluminescent displays (for example, OLED), rely upon accurately patterned sequential layers to form thin film components of the backplane. These components include capacitors, transistors, and power buses. The industry is continually looking for new methods of materials deposition and layer patterning for both performance gains and cost reductions. Thin film transistors (TFTs) may be viewed as representative of the electronic and manufacturing issues for many thin film components. TFTs are widely used as switching elements in electronics, for example, in active-matrix liquid-crystal displays, smart cards, and a variety of other electronic devices and components thereof.

There is a growing interest in depositing thin film semiconductors on plastic or flexible substrates, particularly because these supports are more mechanically robust, lighter weight, and allow more economic manufacturing, for example, by allowing roll-to-roll processing. Plastics, however, typically limit device processing to below 200° C. There are other many issues associated with plastic supports when using traditional photolithography during conventional manufacturing, making it difficult to perform alignments of transistor components across typical substrate widths up to one meter or more. Traditional photolithographic processes and equipment may be seriously impacted by the substrate's maximum process temperature, solvent resistance, dimensional stability, water, and solvent swelling, all key parameters in which plastic supports are typically inferior to glass.

The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below. Additionally, metal oxide dielectrics such as alumina ($Al_2O_3$) and $TiO_2$ are useful in practical electronics applications as well as optical applications such as interference filters. Dielectric materials that are easily processable and patternable are also important to the success of low cost and flexible electronic devices. In addition, metal oxide materials can serve as barrier or encapsulation elements in various electronic devices. These materials also require patterning so that a connection can be made to the encapsulated devices.

Atomic layer deposition (ALD) can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors. Examples of useful semiconducting materials are compound semiconductors such as gallium arsenide, gallium nitride, cadmium sulfide, zinc oxide, and zinc sulfide.

A number of device structures can be made with the functional layers described above. A capacitor results from placing a dielectric between two conductors. A diode results from placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor results from placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the critical interfaces are created.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice, as in any process, it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD processes, typically two molecular precursors are introduced into the ALD reactor in separate stages. U.S. Patent Application Publication 2005/0084610 (Selitser) discloses an atmospheric pressure atomic layer chemical vapor deposition process that involve separate chambers for each stage of the process and a series of separated injectors are spaced around a rotating circular substrate holder track. A spatially dependent ALD process can be accomplished using one or more of the systems or methods described in more detail in WO 2008/082472 (Cok), U.S. Patent Application Publications 2008/0166880 (Levy), 2009/0130858 (Levy), 2009/0078204 (Kerr et al.), 2009/0051749 (Baker), 2009/0081366 (Kerr et al.), and U.S. Pat. No. 7,413,982 (Levy), U.S. Pat. No. 7,456,429 (Levy), and U.S. Pat. No. 7,789,961 (Nelson et al.), U.S. Pat. No. 7,572,686 (Levy et al.), all of which are hereby incorporated by reference in their entirety.

There is growing interest in combining ALD with a technology known as selective area deposition (SAD). As the name implies, selective area deposition involves treating portion(s) of a substrate such that a material is deposited only in those areas that are desired, or selected. Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. One approach to combining patterning and depositing the semiconductor is shown in U.S. Pat. No. 7,160,819 entitled "METHOD TO PERFORM SELECTIVE ATOMIC LAYER DEPOSTION OF ZINC OXIDE" by Conley et al. Conley et al. discuss materials for use in patterning Zinc Oxide on silicon wafers. No information is provided, however, on the use of other substrates, or the results for other metal oxides.

SAD work to date has focused on the problem of patterning a single material during deposition. There persists a problem of combining multiple SAD steps to form working devices. Processes for building complete devices need to be able to control the properties the critical interfaces, particularly in field effect devices like TFTs.

Although there are many approaches to forming high quality dielectric layer they typically fall into one of two categories: a single thick layer of a single material or multiple layers of differing material types. In the case of devices which use a single layer dielectric, large thicknesses are required for defect mitigation to ensure high device yield. This required layer thickness typically requires long processing times and limits the functionality of field effect devices. Devices formed with a multilayer stack of materials use thin layers of materials deposited using the same equipment requiring complex equipment design and multiple precursors. Accordingly, there still remains a need for a high quality dielectric that can be formed from a single material for ease of processing and single precursors, and that doesn't require a thick layer for performance and device yield. Additionally, a method is needed to simply pattern this layer for easy device integration.

SUMMARY OF THE INVENTION

According to an aspect of the invention, a method of producing an inorganic thin film dielectric material layer includes providing a substrate. A first inorganic thin film dielectric material layer is deposited on the substrate using an atomic layer deposition process. The first inorganic thin film dielectric material layer is treated after its deposition. A patterned deposition inhibiting material layer is provided on the substrate. A second inorganic thin film dielectric material layer is selectively deposited on a region of the substrate where the deposition inhibiting material layer is not present using an atomic layer deposition process.

According to another aspect of the present invention, selective area deposition of metal oxides or other materials is used in a process that combines a spatially dependent atomic layer deposition. Advantageously, the present invention is adaptable for deposition on a web or other moving substrate including deposition on large area substrates.

BRIEF DESCRIPTION OF THE DRAWINGS

In the detailed description of the example embodiments of the invention presented below, reference is made to the accompanying drawings, in which:

FIGS. 5a through 5g are cross-sectional side views of one embodiment of the present process of forming the patterned multi-layer dielectric stack as shown in FIG. 5g;

FIGS. 7a through 7g are cross-sectional side views of another embodiment of the present process of forming the patterned multi-layer dielectric stack as shown in FIG. 7g;

FIGS. 8a and 8b are cross-sectional views and plan views, respectively, of one embodiment of the patterned multi-layer dielectric of the present invention;

FIGS. 9a and 9b are cross-sectional views and plan views, respectively, of another embodiment of the patterned multi-layer dielectric of the present invention;

FIGS. 10a and 10b are cross-sectional views and plan views, respectively, of another embodiment of the patterned multi-layer dielectric of the present invention;

FIGS. 11a and 11b are cross-sectional views and plan views, respectively, of one embodiment of a thin film transistor of the present invention;

FIGS. 12a and 12b are cross-sectional views and plan views, respectively, of another embodiment of a thin film transistor of the present invention;

FIGS. 15a and 15b through FIGS. 27a and 27b are cross-sectional views and plan views, respectively, of the process of forming one embodiment of a thin film transistor of the present invention;

FIG. 28 is a cross-sectional side view of a deposition device, used in an exemplified process, showing the arrangement of gaseous materials provided to a substrate that is subject to the thin film deposition process of the Examples;

DETAILED DESCRIPTION OF THE INVENTION

Figure 1:
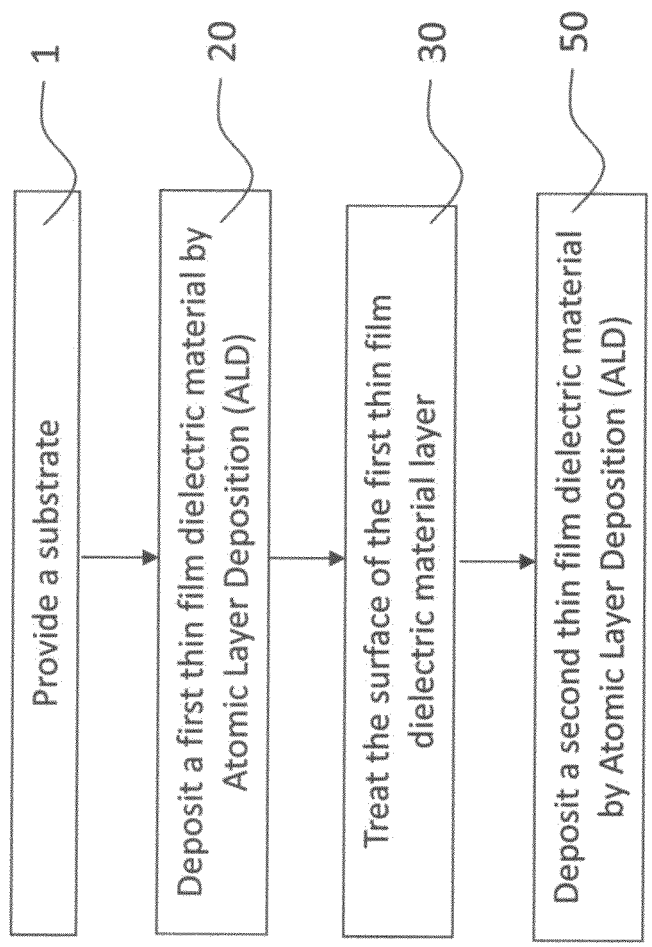
FIG. 1 is a flow chart describing the steps of one embodiment of the present process for forming a multi-layer dielectric.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

The embodiments of the present invention all relate to thin film inorganic materials and devices that contain them. Example embodiments of the present invention use selective area deposition (SAD) in combination with atomic layer deposition (ALD). SAD employs a patterned material referred to as a "deposition inhibitor material", "deposition inhibiting material", or simply an "inhibitor" that inhibits the growth of a thin film material on the substrate when the substrate is subjected to an atomic layer deposition. By inhibiting the growth where the deposition material is present, the deposition only deposits in regions (selective areas) of the substrate where the inhibitor is not present. The phrase "deposition inhibitor material" and its equivalents refer herein to any material on the substrate that inhibits the deposition of material during atomic layer deposition (ALD). The "deposition inhibitor material" includes the material applied to the substrate as well as the material resulting from any optionally subsequent crosslinking or other reaction that modifies the material that can occur prior to depositing an inorganic thin film on the substrate by atomic layer deposition. A polymeric deposition inhibitor material can be crosslinked after applying the polymer onto the substrate, before or during the pattering step.

The deposition inhibitor material can be a compound or polymer that, after being applied, is subsequently polymerized, crosslinked, or polymerized and crosslinked. The deposition inhibitor material can be a compound or polymer that forms a self-assembled monolayer on the substrate. Polymers are preferably addition polymers such as, for example, a poly(perfluoroalkyl methacrylate); poly(perfluoroalkyl methacrylate); poly(methyl methacrylate); poly(cyclohexyl methacrylate); poly(benzyl methacrylate); poly(iso-butylene); poly(9,9-dioctylfluorenyl-2,7-diyl); polystyrene; poly(vinyl alcohol); poly(methyl methacrylate); poly(hexafluorobutyl methacrylate), and copolymers thereof, wherein the alkyl has one to six carbon atoms.

Crosslinking can be used to insolubilize a polymeric deposition inhibitor material after application onto the surface of the substrate. The crosslinking can occur prior to patterning or can occur during patterning in order to contribute to the patterning step, for example, by employing crosslinking initiated by, and patterned by, actinic radiation, followed by removal of non-crosslinked polymer, for example, by solvent.

The deposition inhibitor material can be an organosiloxane polymer. Organosiloxane polymers are defined to include polymers, prepolymers, or macromonomers having at least 20 siloxane repeat units. Particularly preferred are deposition inhibitor materials that, after application onto the substrate, and any crosslinking or intermolecular reaction, are insoluble. Such organosiloxane polymers include random or block or crosslinked polymers or combinations thereof. Optionally, functional groups can be present on the organosiloxane polymer such as terminal groups (also referred to as end caps). Crosslinking groups or functional groups or combinations of crosslinking groups and functional groups can also be present, for example, located on a side chain off a siloxane backbone. Examples of organosiloxane polymers include poly(alkylsiloxane), poly(arylsiloxane), poly(alkylarylsiloxane), and poly(alkyl(aryl)siloxane), each optionally having functional groups.

Functionalized poly(siloxanes) include epoxy-functionalized, carboxyl-functionalized, polyether-functionalized, phenol-functionalized, amino-functionalized, alkoxy-functionalized, methacryl-functionalized, carbinol-functionalized, hydroxy-functionalized, vinyl-functionalized, acrylic-functionalized, silane-functionalized, trifluoro-functionalized, or mercapto-functionalized poly(organosiloxanes). Block copolymers can also be employed if containing substantial siloxane repeat units. Such polymers can be prepared as described in numerous patents and publications or are commercially available from, for example, General Electric Company, Schenectady, N.Y.; Dow Corning, Midland, Mich.; or Petrarch Systems, Bristol, Pa.

The deposition inhibiting material layer includes one of a self assembled monolayer, a polymer, and a water soluble polymer. The self assembled monolayer can be performed by exposing the substrate to a vapor, a liquid, or a liquid solution of a precursor material. Precursor materials include silanes, phosphonates, thiols, alcohols, amines, or ammonium salts. The polymer can be soluble in any convenient solvent and can have any useful molecular weight, preferably in the range of 2,000 to 2,000,000. It can include a single functional group, or can include a plurality of functional groups. In the case of a plurality, the polymer can be a random, periodic, or block polymer. For polymers with chiral centers the polymer can be isotactic, syndiotactic, or atactic. The polymer can have side chains and can be a graft copolymer. The polymer can be linear or branched. The polymer can have low numbers of free acid groups. Preferred polymers that a soluble in non polar solvents are poly(methylmethcrylate), silicone polymers including poly(dimethylsiloxane), poly(carbonates), poly(sulfones), and poly(esters). Polymers with chemical modification are preferred, including polymers modified with fluorine or fluorine containing compounds. Polymers soluble in polar solvents such as water, alcohols, or ketones are particularly preferred. Polymers can include amide groups, such as poly(amide), poly(vinylpyrollidone), and poly(2-ethyl-oxazoline). Polymers can include ether linkages, such as poly(ethylene glycol). Polymers can include alcohol functionalities, such as poly(vinyl alcohol). Polymers can include neutralized acid groups such as sodium poly(styrene sulfonate) and the sodium salt of poly(acrylic acid).

In some embodiments, the deposition inhibitor material is chosen specifically for the material to be deposited. The deposition inhibitor material has a given inhibition power. The inhibition power is defined as the layer thickness at or below which the deposition inhibitor material is effective. Preferably, the deposition inhibitor material, during use, exhibits an inhibition power of at least 50 Å, more preferably at least 100 Å, most preferably at least 300 Å. The deposition of the deposition inhibitor material can be in a patterned manner, such as using inkjet, flexography, gravure printing, micro-contact printing, offset lithography, patch coating, screen printing, or transfer from a donor sheet. In alternative embodiments, a uniform layer of the deposition inhibitor material can be deposited and then patterned form a patterned layer of the deposition inhibitor material. Preprocessing treatments for patterning the inhibitor include patterning of substrate prior to inhibitor application to modify the hydrophobilicity, electric charge, absorption, or roughness of the substrate. Post processing treatments include light exposure, light exposure and subsequent liquid based development, and ablation.

Providing the patterned deposition inhibiting material layer on the substrate includes using at least one of an inkjet printing process, a flexographic printing process, a gravure printing process, and a photolithographic printing process. The active inhibiting material can be suspended or dissolved in a solvent or vehicle. The material can include surfactants, stabilizers, or viscosity modifiers. The printed material can be dried using natural convection, forced convection, or radiant heat. The material can be treated to change its morphology or chemical composition. A preferred chemical composition change is to crosslink the material. The change in morphology or chemical composition can be accomplished by exposure to a vapor phase or liquid phase reactant, or treatment with heat or light. Preferred processes include the crosslinking of material with UV light.

The process of making the thin films of the present invention can be carried out below a maximum support temperature of about 300° C., more preferably below 250° C., or even at temperatures around room temperature (about 25° C. to 70° C.). These temperatures are well below traditional integrated circuit and semiconductor processing temperatures, which enable the use of any of a variety of relatively inexpensive supports, such as flexible polymeric supports. Thus, the invention enables production of relatively inexpensive circuits containing thin film transistors with significantly improved performance.

The substrates used in the present invention can be any material that acts as a mechanical support for the subsequently coated layers. The substrate can include a rigid material such as glass, silicon, or metals. Particularly useful metals are stainless steel, steel, aluminum, nickel, and molybdenum. The substrate can also include a flexible material such as a polymer film or paper such as Teslin. Useful substrate materials include organic or inorganic materials. For example, the substrate can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly (ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 µm to about 1 cm.

A flexible support or substrate can be used in the present invention. Using a flexible substrate allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate any electric components such as thin film transistors. Nominally rigid materials that are flexible due to their thinness can also be used. These include glass at thicknesses below 200 µm and metals at thicknesses below 500 µm.

In some example embodiments, the substrate can include a temporary support or support material layer, for example, when additional structural support is desired for a temporary purpose, e.g., manufacturing, transport, testing, or storage. In these example embodiments, substrate can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The substrate can be bare indicating that it contains no substantial materials on its surface other the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The substrate can also include on its surface patterned materials. These patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed is removed from the vacuum chamber. A second precursor is then applied to react with the first precursor on the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, U.S. Pat. No. 7,789,961, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations can experience alignment issues, for example, web tracking or stretching issues, the architecture of the present invention reduces reliance on high resolution or very fine alignment features during the manufacturing process. As such, S-ALD is well suited for manufacturing the present invention.

The preferred process of the present invention employs a continuous spatially dependent ALD (as opposed to pulsed or time dependent ALD) gaseous material distribution. The process of the present invention allows operation at atmospheric or near-atmospheric pressures and is capable of operating in an unsealed or open-air environment. The process of the present invention is adapted such that material is deposited only in selected areas of a substrate.

Atomic layer deposition can be used in the present invention to deposit a variety of inorganic thin films that are metals or that comprise a metal-containing compound. Such metal-containing compounds include, for example (with respect to the Periodic Table) a Group V or Group VI anion. Such metal-containing compounds can, for example, include oxides, nitrides, sulfides or phosphides of zinc, aluminum, titanium, hafnium, zirconium or indium, or combinations thereof.

Oxides that can be made using the process of the present invention include, but are not limited to: zinc oxide (ZnO), aluminum oxide ($Al_2O_3$), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, $Mg_xZn_{1-x}O$, and LiZnO.

A dielectric material is any material that is a poor conductor of electricity. Such materials typically exhibit a bulk resistivity greater than $10^{10}$ Ω-cm. Examples of dielectrics are SiO2, HfO, ZrO, $SiN_x$, and $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, and gallium arsenide. Particularly preferred semiconductors are zinc oxide, indium zinc oxide, and gallium indium zinc oxide. The semiconductors can be doped to render them n-type or p-type, or to modulated the number of charge carriers present.

Metals that can be made using the process of the present invention include, but are not limited to: copper, tungsten, aluminum, nickel, ruthenium, and rhodium. It should be apparent to the skilled artisan that alloys of two, three, or more metals can be deposited, compounds can be deposited with two, three, or more constituents, and such things as graded films and nano-laminates can be produced as well.

These variations are simply variants using particular embodiments of the invention in alternating cycles. There are many other variations within the scope of the invention, so the invention is limited only by the claims that follow.

For various volatile zinc-containing precursors, precursor combinations, and reactants useful in ALD thin film processes, reference is made to the *Handbook of Thin Film Process Technology*, Vol. 1, edited by Glocker and Shah, Institute of Physics (IOP) Publishing, Philadelphia 1995, pages B1.5:1 to B1.5:16, hereby incorporated by reference, and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the process of the present invention.

Optionally, the present process can be accomplished using a new ALD process which negates the need for a vacuum chamber. This process, commonly referred to as S-ALD, is described in at least one of commonly assigned U.S. Pat. Nos. 7,413,982; 7,456,429; 7,789,961; and US Patent Application Publication No. US 2009/0130858. All of the above-identified patents and patent applications are incorporated by reference herein in their entirety.

Two suitable approaches to combining patterning and depositing the semiconductor are described in US Patent Application Publication No. 2009/0081827 A1, published to Yang et al., on Mar. 26, 2009, the disclosure of which is hereby incorporated by reference in its entirety; and U.S. Pat. No. 8,017,183 B2, issued to Yang et al., on Sep. 13, 2011, the disclosure of which is hereby incorporated by reference in its entirety. Given that the preferred subsequent layers are deposited and conformally coated by atomic layer deposition (ALD), preferred deposition inhibitor materials are described in U.S. Pat. No. 7,998,878 B2, issued to Levy et al., on Aug. 16, 2011, the disclosure of which is hereby incorporated by reference in its entirety. In addition, deposition inhibitor materials are chosen to be compatible with printing on large flexible substrates in a low cost manner.

In some embodiments of the present invention, treating the surface prior to depositing a layer by ALD is an important process step. For the description that follows, the term "treating" can be taken to mean subjecting the substrate to a different environmental condition than that experienced during the ALD deposition. Treating can occur either within the ALD system, or preferably, the substrate is removed from the system and treated off-line. Surface treatments include dry cleaning, such as a UV-ozone treatment, or a gas plasma, for example and preferably an oxygen plasma. Other treatments include wet clean steps, hold at ambient conditions, wet or dry etching the surface of a material layer, and other processes. An example cleaning process includes a liquid process using a solvent or a detergent. The liquid process can utilize a mechanical action such as brushing or wiping or pressure jets. The cleaning process can also be a vapor process. These processes include exposing the substrate to a vapor reactant that causes cleaning. The vapor exposure can include forms of energy to promote the process. These include light exposure, arcs, or plasmas. Particularly desired light exposures include UV exposure, especially in the presence of oxygen to produce ozone (UV-ozone). Plasmas include plasmas of various species including oxygen, chlorine, and fluorine. Plasmas created with these materials or with precursors that produce these materials are included in the present invention.

Turning now to the figures, FIG. 1 is a diagrammatic step diagram for one embodiment of a process of the present invention for making a quality thin film inorganic dielectric using atomic layer deposition (ALD). As shown in Step 1, a substrate is supplied into the system. The substrate can be any substrate as discussed that is suitable for use in the ALD system. Next, Step 20 deposits the desired first thin film dielectric material by an ALD process. Generically this deposition can be using any ALD system, preferably a spatial ALD system. After the first thin film dielectric material is deposited in Step 20, the surface of the first thin film dielectric material layer is treated in Step 30. Treating Step 30 requires that the substrate with the first thin film dielectric material be subjected to a different environmental condition than that experienced during the deposition of the first thin film dielectric. Treating can occur either within the ALD system, or preferably, the substrate is removed from the system and treated off-line. Surface treatments include dry cleaning, such as a UV-ozone treatment, gas plasma, preferably an oxygen plasma. Other treatments include wet clean steps, hold at ambient conditions, wet or dry etching the surface of the first thin film dielectric material layer, and other processes.

After treating the surface of the first thin film dielectric material layer, a second thin film dielectric material is deposited by ALD in Step 50. The second thin film dielectric material can be the different from that of the first thin film dielectric material, or preferably the same as that of the first thin film dielectric material. The layer thickness of the first and second thin film dielectric material can be the same or different. At least one of the first inorganic thin film dielectric material layer and the second inorganic thin film dielectric material layer can include $Al_2O_3$, $SiO_2$, HfO, ZrO, $TiO_2$, $Ta_2O_5$, $Si_xN_y$, or any other thin film inorganic material that can be deposited by ALD. Preferably both thin film dielectric material layers are $Al_2O_3$.

Figure 2:
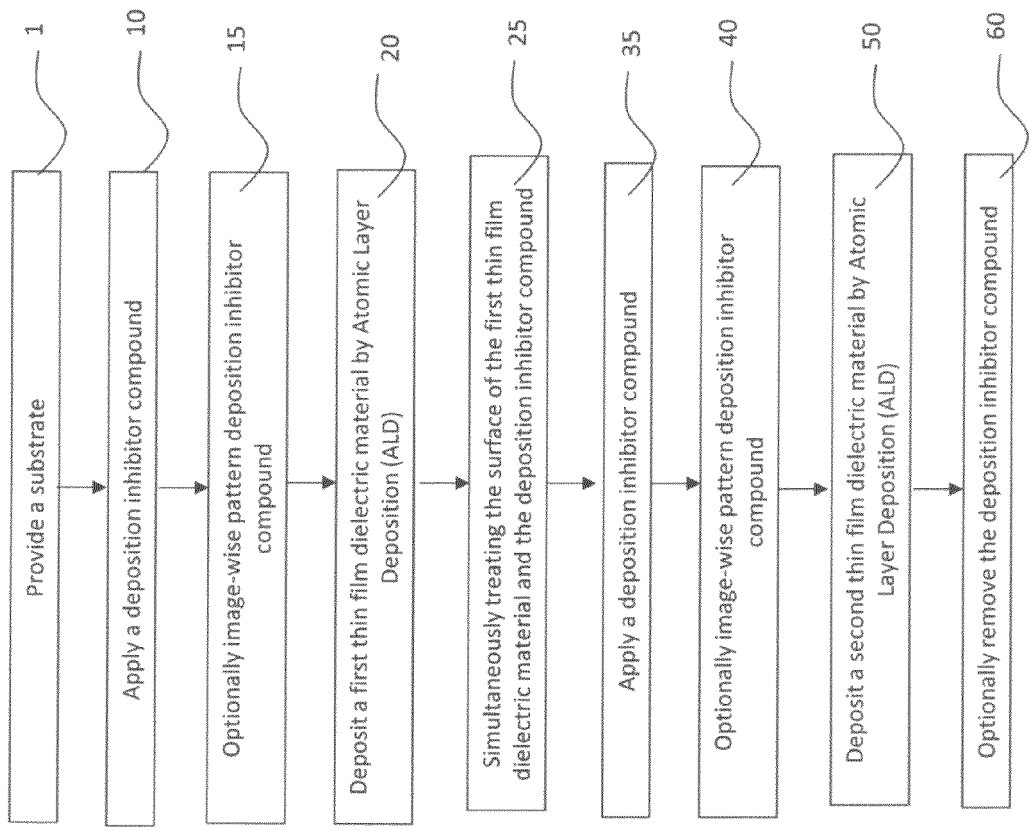
FIG. 2 is a flow chart describing the steps of one embodiment of the present process for forming a patterned multi-layer dielectric.

The process flow described by FIG. 1 is effective in making a quality dielectric layer that can be subsequently patterned. Turning now to FIG. 2, a diagrammatic Step diagram is shown for one embodiment of a process of the present invention for making a patterned thin film inorganic dielectric using a combination of selected area deposition (SAD) and ALD. As shown in Step 1, a substrate is supplied into the system. In Step 10 a deposition inhibitor material is deposited. The deposition inhibitor material can generically be any material that causes the material deposition to be inhibited and should be understood from the previous descriptions. In one embodiment, the deposition inhibitor material is chosen specifically for the material to be deposited. In other embodiments, the deposition inhibitor material has a given inhibition power. The inhibition power is defined as the layer thickness at or below which the deposition inhibitor material is effective. The deposition of the deposition inhibitor material in Step 10 can be in a patterned manner, such as using inkjet, flexography, gravure printing, micro-contact printing, offset lithography, patch coating, screen printing, or transfer from a donor sheet. In an alternative embodiment, Step 10 can deposit a uniform layer of the deposition inhibitor material and Step 15 can be optionally employed to form a patterned layer of the deposition inhibitor material.

Continuing with FIG. 2, Step 20 deposits the desired first thin film material by an Atomic Layer Deposition (ALD) process. Generically this deposition can be using any ALD system, preferably a spatial ALD system. The thin film material is deposited only in the areas of the substrate where there is no deposition inhibitor material. After the first thin film dielectric material is deposited in Step 20, the surface of the first thin film dielectric material layer and the deposition inhibitor compound are treated simultaneously in Step 25. Treating Step 25 requires that the substrate with the first thin film dielectric material and deposition inhibitor compound be subjected to a different environmental condition than that experienced during the deposition of the first thin film dielectric material. Treating can occur either within the ALD system, or preferably, the substrate is removed from the system and treated off-line. Surface treatments include dry cleaning, such as a UV-ozone treatment, gas plasma, preferably an oxygen plasma. Other treatments include wet clean steps, hold at ambient conditions, and the like. Simultaneous treating Step 25 can partially or completely remove the deposition inhibitor material. After the surface treatment, a deposition inhibitor is applied in Step 35. As in Step 10, the deposition inhibitor material can be deposited in a patterned manner, or as a uniform layer and Step 35 can be optionally employed to form a patterned layer of the deposition inhibitor material. The pattern of the second patterned deposition inhibiting material can be the same as or different than the pattern of the first patterned deposition inhibiting material.

After providing the second patterned deposition inhibiting material layer on the substrate a second thin film dielectric material is deposited by ALD in Step 50. The second thin film dielectric material can be the different from that of the first thin film dielectric material, or preferably the same as that of the first thin film dielectric material. The layer thickness of the first and second thin film dielectric material can be the same or different. After depositing the second thin film dielectric material, the deposition inhibitor material can be optionally removed in Step 60.

The process flow described in FIG. 2 can be better understood through the descriptive process build shown in FIGS. 5a through 5g. In FIG. 5a, the substrate 200 is provided as in Step 1 of FIG. 2. FIG. 5b shows the first patterned deposition inhibiting material layer 210 on the substrate 200. The first pattern deposition inhibiting material layer 210 contains regions 215 where the first deposition inhibiting material layer is not present. FIG. 5c illustrates the patterned first inorganic thin film dielectric material 220 obtained after coating the first pattern deposition inhibiting material layer 210 using an ALD process. Next, the patterned first inorganic thin film dielectric material 220 and the first pattern deposition inhibiting material layer 210 are simultaneously treated cleaning the surface of the patterned first inorganic thin film dielectric material 220 and removing the first pattern deposition inhibiting material layer 210 as shown in FIG. 5d. Next, a second pattern deposition inhibiting material layer 230 is deposited on the substrate. As illustrated in FIG. 5e the first patterned deposition inhibiting material layer 210 and the second patterned deposition inhibiting material layer 230 have the same pattern, it should be understood that the first pattern 210 and the second pattern 230 can be different. The second patterned deposition inhibiting material layer 230 has regions 235 where the second deposition inhibiting material layer is not present. Regions 235 overlap with the regions containing the first patterned first inorganic thin film dielectric material 220. After the second patterned deposition inhibiting material layer 230 is provide, a patterned second inorganic thin film dielectric material 240 is deposited by treating the substrate surface to an ALD coating such that the second inorganic thin film dielectric material is only deposited in the regions 235 where the second deposition inhibiting material is not present. The patterned first inorganic thin film dielectric material 220 and patterned second inorganic thin film dielectric material 240 in combination form the patterned inorganic thin film dielectric stack 250 as illustrated in FIG. 5f. If the second patterned deposition inhibiting material layer 230 is optionally be removed, the patterned inorganic thin film dielectric stack 250 as shown in FIG. 5g is obtained.

FIGS. 7a through 7g describe a variation the process flow of FIG. 2. FIGS. 7a through 7c are equivalent to FIGS. 5a through 5c, and should be understood from the previous descriptions. FIG. 7d illustrates the resulting substrate after the patterned first inorganic thin film dielectric material 220 and the first pattern deposition inhibiting material layer 210 are simultaneously treated, cleaning the surface of the patterned first inorganic thin film dielectric material 220 and leaving a partially removed first pattern deposition inhibiting material layer 225. The patterned inorganic thin film dielectric stack 250 is completed using the same process steps as in FIGS. 5e through 5g, and as such FIGS. 7e through 7g should be understood from the previous descriptions.

Figure 3:
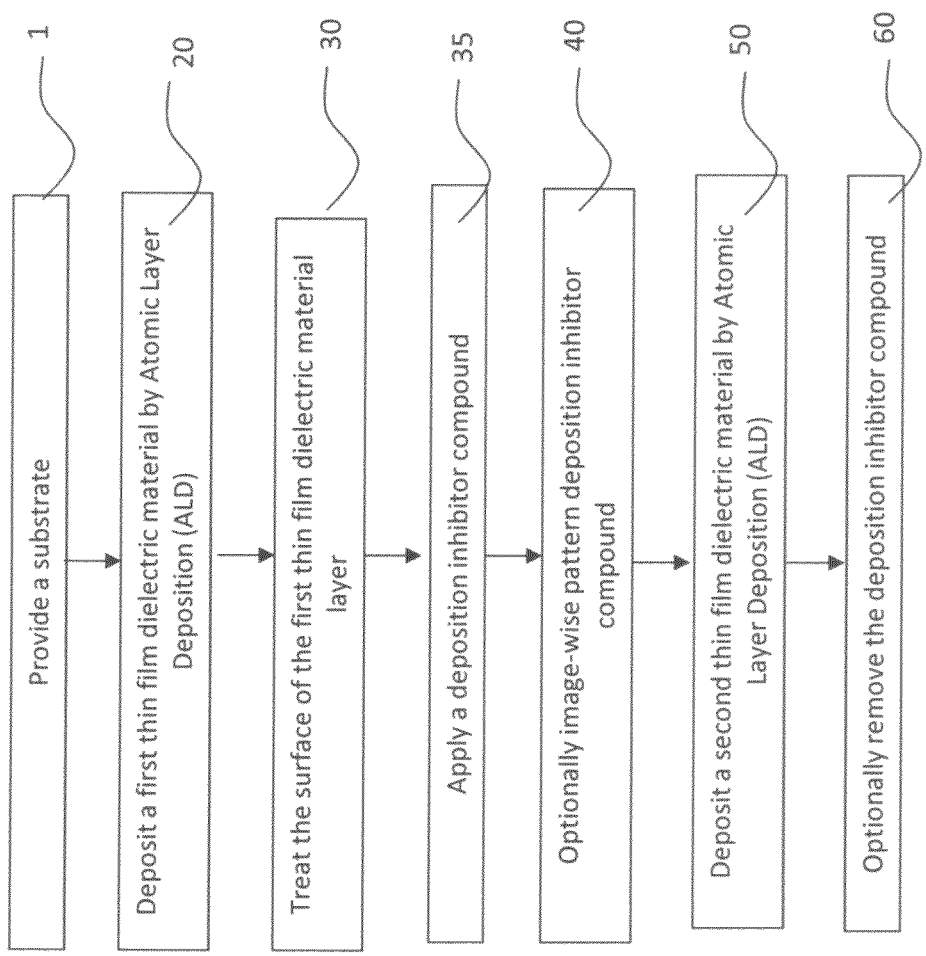
FIG. 3 is a flow chart describing the steps of another embodiment of the present process for forming a patterned multi-layer dielectric.

The process flows described by FIG. 1 and FIG. 2 are effective in making a quality unpatterned dielectric layer or fully patterned dielectric layer respectively. Turning now to FIG. 3, a diagrammatic Step diagram is shown for one embodiment of a process of the present invention for making a partially patterned thin film inorganic dielectric layer using a combination of selected area deposition (SAD) and ALD. Steps 1, 20 and 30 should be understood from the description of FIG. 1. After the surface of the first thin film dielectric material layer is treated in Step 30, a deposition inhibitor is applied in Step 35 and Step 40 can be optionally employed to form a patterned layer of the deposition inhibitor material in cases where a uniform layer of deposition inhibitor is applied in Step 35. After providing the patterned deposition inhibiting material layer on the substrate a second thin film dielectric material is deposited by ALD in Step 50. The second thin film dielectric material can be the different from that of the first thin film dielectric material, or preferably the same as that of the first thin film dielectric material. The layer thickness of the first and second thin film dielectric material can be the same or different. After depositing the second thin film dielectric material, the deposition inhibitor material can be optionally removed in Step 60.

FIG. 8*a* is a cross-sectional diagram of an electronic element, taken along the line A-A' of the plan view shown in FIG. 8*b*. The processes described in relation to FIGS. 1, 2, 3 5 and 7 can be used to form this electronic element and other electronic elements. The electronic element shown in FIGS. 8*a* and 8*b* is a simple structure that should be illustrative of any element that contains two conductive layers that need to be kept electrically isolated. As shown in FIG. 8*b*, on substrate 400, there is patterned first electrically conductive material 410 and patterned second electrically conductive material 420 that overlap (in plan-view) at overlap regions 425. As shown in FIG. 8*a*, the patterned first electrically conductive material 410 can be composed of a single material, or can include a plurality of material layers. Similarly the second conductive material 210 can be composed of a single material, or a plurality of material layers. In order to keep the first electrically conductive material 410 and second electrically conductive material 420 from electrically shorting, a patterned inorganic thin film dielectric stack 450 is disposed between them. Patterned inorganic thin film dielectric stack 450 is made up of patterned first inorganic thin film dielectric material 430 and patterned second inorganic thin film dielectric material 440. As shown in FIG. 8*b*, the patterns of the first 430 and second 440 inorganic thin film dielectric materials are the same pattern and have the same material composition. Although the patterned first inorganic thin film dielectric material 430 and patterned second inorganic thin film dielectric material 440 have the same material composition, they do not have the same analytical signature as a single layer with a combined thickness of the same material. Due to the sequential processing of the two inorganic thin film dielectric material layers and the treatment required at the interface in order to achieve a quality patterned inorganic thin film dielectric stack 450, there is an analytical (sometimes referred to as compositional) signature at the interface. Typically, during the treatment of the interface, the surface of the substrate acquires a difference in chemical composition. This can manifest itself as a variation in the concentration of atomic species formally included in the deposition materials or as the presence of impurity atoms or molecules. This difference in chemical composition is present at the interface region between the patterned first inorganic thin film dielectric material 430 and patterned second inorganic thin film dielectric material 440. This difference can be detected by depth profiling the patterned inorganic thin film dielectric stack 450, where a small change in either the relative amounts of the deposition materials or impurities can be detected at the interface (or contact region) between the two layers. One analytical technique that can be used for depth profiling films is time-of-flight secondary ion mass spectroscopy (ToF SIMS).

Figure 30:
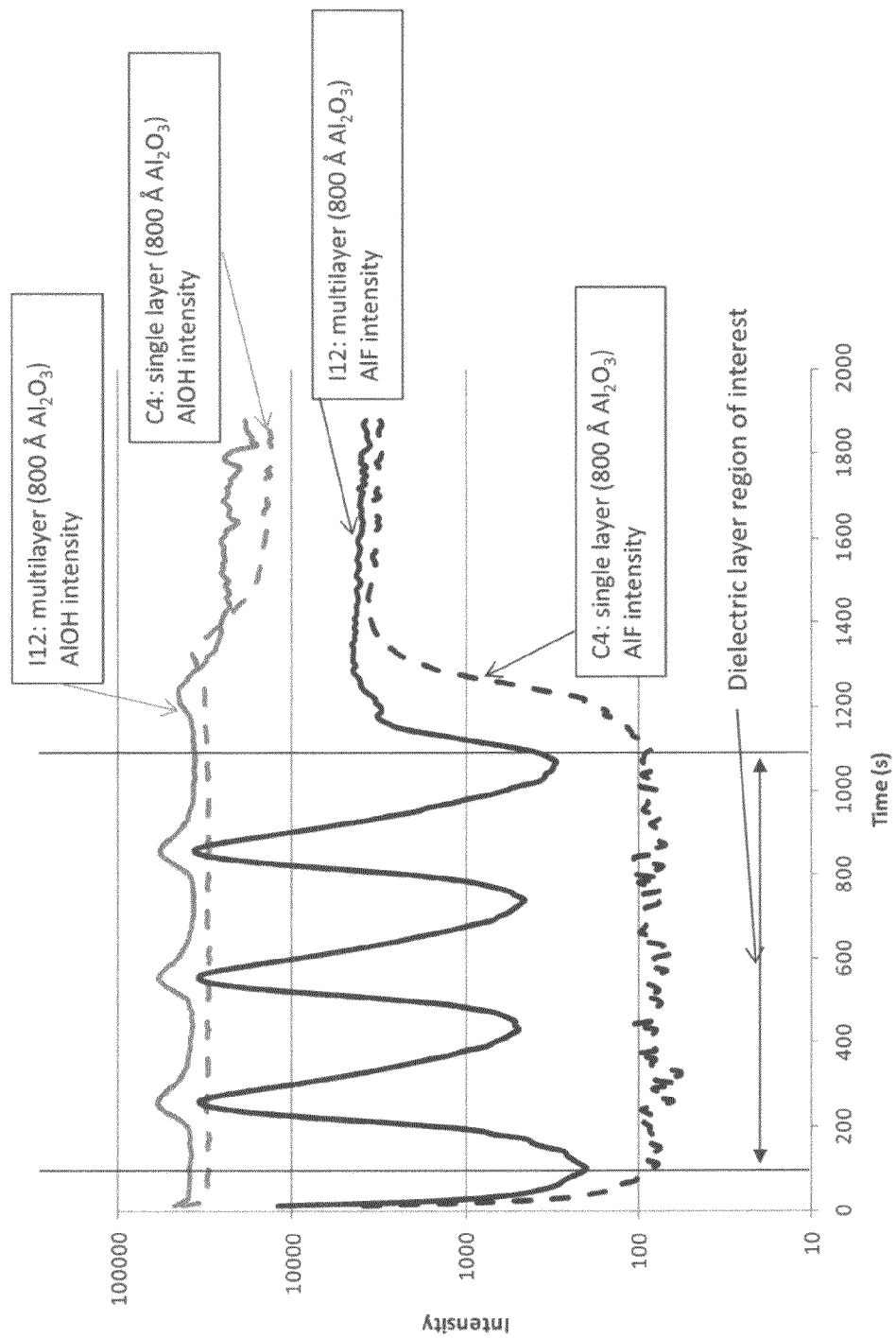
FIG. 30 is a plot comparing the intensity signal of two species in a single layer dielectric film and a multilayer dielectric film.

FIG. 30 shows the profiles of AlF and AlOH from a positive polarity ToF SIMS analysis of a single layer of growth and a layer containing multiple interfaces of $Al_2O_3$. FIG. 30 also shows the region of interest of the dielectric layer analyzed. The region of interest excludes the top surface of the dielectric layer and the interface between the dielectric layer and the substrate as well as the substrate itself. AlF and AlOH were chosen as representative of the types of species detected with this analysis technique. Other species can be used for detection purposes. Species that can be found at the interface in a dielectric stack can depend on a number of variables including the type of treatment, the equipment used for treatment, the dielectric composition, substrate composition, and others.

As seen in FIG. 30, single layer films typically have profiles that are generally flat with intensity variations of less than 10%. The presence of one or more peaks in the intensity signal is indicative of an interface in the material that has received a treatment process. Changes in the intensity signal due to the treatment at the interface can also be valleys, or manifest as a reduction in signal from the baseline. The analysis of a film with multiple interfaces produces a signal containing a number of peaks (or intensity changes) corresponding to the number of interfaces. It is expected that one skilled in the art should be able to detect meaningful differences in the signal (peaks) over signal noise that is associated with the analytical technique. Peaks that differ by 50% or more from the baseline or valley are typical, although depending on the amount of the species present and the sensitivity of the technique peaks can differ by 5000% or more. As seen in FIG. 30, the signal associated with AlOH and the signal associated with AlF each have three peaks corresponding to three interfaces contained within the multilayer dielectric stack. The signal associated with AlOH varies by 60%, while the signal associated with AlF varies by about 10,800%. The presence of the peaks is a marker that indicates that an inorganic dielectric layer is indeed a patterned inorganic thin film dielectric stack and not a single layer of material.

A change in the intensity signal within the dielectric stack 450 for an impurity or compositional species that is 50% or greater is also indicative that the inorganic dielectric layer is indeed a patterned inorganic thin film dielectric stack 450 and not a single layer of material. As shown in FIG. 8*a*, the thickness of the first inorganic thin film dielectric material layer 430 and the thickness of the second inorganic thin film dielectric material layer 440 are same. Alternatively, the first inorganic thin film dielectric material layer 430 and the second inorganic thin film dielectric material layer 440 can differ in thickness. As shown in FIG. 8*a*, the first inorganic thin film dielectric material layer and the second inorganic thin film dielectric material layer are in contact with each other.

FIG. 9*a* is a cross-sectional diagram of an electronic element, taken along the line A-A' of the plan view shown in FIG. 9*b*. The electronic element of FIGS. 9*a* and 9*b* is similar to that shown in FIGS. 8*a* and 8*b*. As shown in FIG. 9*b*, on substrate 400, there is patterned first electrically conductive material 410 and patterned second electrically conductive material 420 that overlap (in plan-view) at overlap regions 425. In order to keep the first electrically conductive material 410 and second electrically conductive material 420 from electrically shorting, a patterned inorganic thin film dielectric stack 450 is disposed between them. In this embodiment the patterned first inorganic thin film dielectric material 470 has a different pattern from that of the patterned second inorganic thin film dielectric material 460. As shown in FIGS. 9*a* and 9*b*, the patterned first inorganic thin film dielectric material 470 has a larger area than that of the patterned second inorganic thin film dielectric material 460, however it should be appreciated that this difference is for illustrative purposes and that the patterns of the first 470 and second 40 inorganic thin film dielectric materials can have any desired relationship. The first inorganic thin film dielectric material layer 470 and the second inorganic thin film dielectric material layer 460 have the same material composition.

FIG. 10a is a cross-sectional diagram of an electronic element, taken along the line A-A' of the plan view shown in FIG. 10b. The electronic element of FIGS. 10a and 10b illustrate a likely outcome when actually manufacturing the electronic element depicted in FIGS. 8a and 8b. As shown in FIG. 10b, on substrate 400, there is patterned first electrically conductive material 410 and patterned second electrically conductive material 420 that overlap (in plan-view) at overlap regions 425. In order to keep the first electrically conductive material 410 and second electrically conductive material 420 from electrically shorting, a patterned inorganic thin film dielectric stack 450 is disposed between them. As shown in FIGS. 10a and 10b, the patterned first inorganic thin film dielectric material 475 has the same pattern as that of the patterned second inorganic thin film dielectric material 465 but there is a misalignment of the two patterns. This misalignment can be a natural consequence of misalignment during applying or patterning the second deposition inhibitor pattern when the element is form from the combination of SAD and ALD. Even "perfectly" aligned patterns within manufacturing tolerances often have edges that are detectably misaligned using common analytical techniques, including simple optical microscope inspection. The first inorganic thin film dielectric material layer 475 and the second inorganic thin film dielectric material layer 465 have the same material composition.

Figure 4:
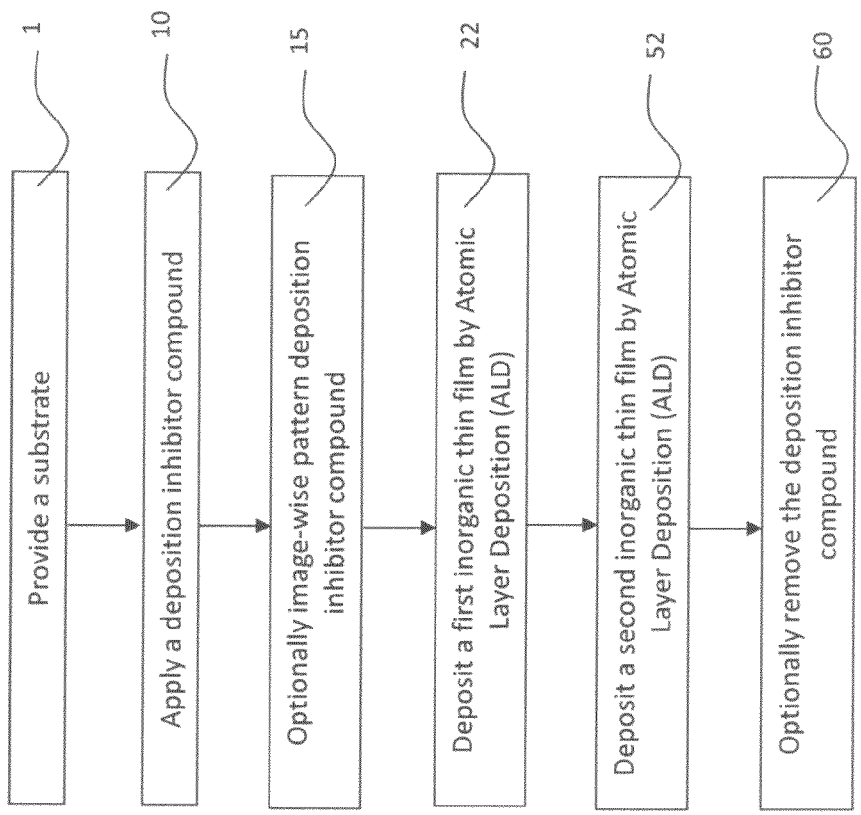
FIG. 4 is a flow chart describing the steps of one embodiment of the present process for forming a patterned multi-layer stack.

In semiconductor processing, it is sometimes desirable to have two layers of different materials that have the same pattern. Depending on the composition of the two layers, it may not be easy to uniformly deposit and then pattern the materials. In FIG. 4, a diagrammatic Step diagram is shown for one embodiment of a process of the present invention for making a patterned thin film inorganic material stack using a combination of selected area deposition (SAD) and ALD. As shown in Step 1, a substrate is supplied into the system. In Step 10 a deposition inhibitor material is deposited. The deposition inhibitor material can generically be any material that causes the material deposition to be inhibited and should be understood from the previous descriptions. In one embodiment, the deposition inhibitor material is chosen specifically for the material to be deposited. In other embodiments, the deposition inhibitor material has a given inhibition power. The inhibition power is defined as the layer thickness at or below which the deposition inhibitor material is effective. The deposition of the deposition inhibitor material in Step 10 can be in a patterned manner, such as using inkjet, flexography, gravure printing, micro-contact printing, offset lithography, patch coating, screen printing, or transfer from a donor sheet. In an alternative embodiment, Step 10 can deposit a uniform layer of the deposition inhibitor material and Step 15 can be optionally employed to form a patterned layer of the deposition inhibitor material.

Continuing with FIG. 4, Step 22 deposits the desired first thin film material by an Atomic Layer Deposition (ALD) process. Generically this deposition can be using any ALD system, preferably a spatial ALD system. The first thin film material is deposited only in the areas of the substrate where there is no deposition inhibitor material. After the first thin film dielectric material is deposited in Step 22, a second thin film material layer is deposited by ALD in Step 52. The second thin film material is deposited only in the areas of the substrate where there is no deposition inhibitor material, and as such is patterned into the same pattern as the first thin film material layer. The second thin film dielectric material is different in composition from that of the first thin film dielectric material. The layer thickness of the first and second thin film inorganic materials can be the same or different.

After depositing the second thin film material, the deposition inhibitor material can be optionally removed in Step 60. The deposition inhibitor can be removed by a liquid process using a solvent or a detergent. The liquid process can utilize a mechanical action such as brushing or wiping or pressure jets. The deposition inhibitor can also be removed by a vapor process. These processes include exposing the substrate to a vapor reactant that causes removal of the inhibitor. The removal can happen spontaneously upon reaction with the vapor, resulting in the conversion of the inhibitor to a volatile species. Alternatively, the vapor exposure can react with the inhibitor converting it to another species or morphology that is then more easily removable with another process, such as a liquid process. The vapor exposure can include forms of energy to promote the process. These include light exposure, and arcs or plasmas. Particularly desired light exposures include UV exposure, especially in the presence of oxygen to produce ozone. Plasmas include plasmas of various species including oxygen, chlorine, and fluorine. Plasmas created with these materials or with precursors that produce these materials are included in the present invention.

Figure 6A:
FIGS. 6a through 6e are cross-sectional side views of one embodiment of the present process of forming the patterned multi-layer stack as shown in FIG. 6e.
Figure 6B:
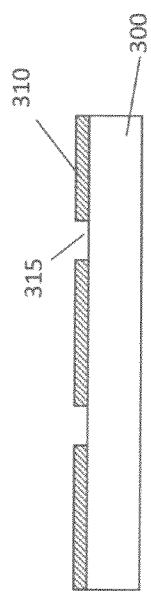
Figure 6C:
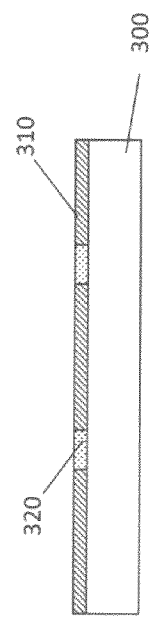
Figure 6D:
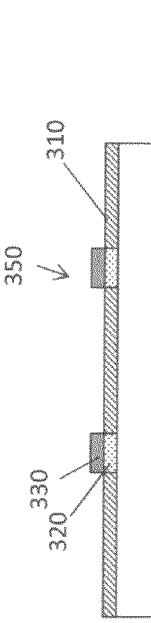
Figure 6E:
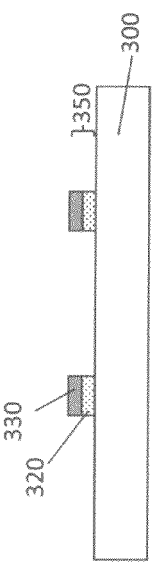

FIGS. 6a through 6e are a schematic diagram for one embodiment of a method of producing an inorganic multi-layered thin film structure using a combination of selected area deposition (SAD) and ALD and the process described in FIG. 4. FIG. 6a shows a substrate 300. FIG. 6b shows the application the patterned deposition inhibiting material layer 310 to substrate 300, leaving region 315 where the deposition inhibiting material layer is not present. FIG. 6c shows the result of deposition of a first inorganic thin film 320 by an Atomic Layer Deposition (ALD) process on the substrate, resulting in patterned deposition of the first inorganic thin film in regions 315 and little to no deposition of the first inorganic thin film in areas covered by deposition inhibitor 310. FIG. 6d shows the result of deposition of a second inorganic thin film by an Atomic Layer Deposition (ALD) process on the substrate, resulting in patterned second inorganic thin film material 330 in the same areas 315 as the first inorganic thin film and little to no deposition of the second inorganic thin film in areas covered by deposition inhibitor 310. The resulting inorganic multi-layered thin film structure 350 now includes a stack of two inorganic thin films. FIG. 6e shows the substrate after an optional removal of the deposition inhibitor, leaving substantially only the inorganic multi-layered thin film structures 350 on the original substrate 300.

The first inorganic thin film material layer 320 and the second inorganic thin film material layer 330 can have different material compositions. The difference in material composition can include differences in one or more of the atomic constituents that compose the inorganic thin film. The difference in composition can include only a change in the atomic ratio of the constituents that compose the inorganic thin film.

The first inorganic thin film material layer 320 can include a dielectric material and the second inorganic thin film material layer can include a semiconductor material 330, wherein selectively depositing the second inorganic thin film material layer includes selectively depositing the second inorganic thin film material layer on the first inorganic thin film material layer after the first inorganic thin film material layer has been deposited on the substrate. Alternatively, the first inorganic thin film material layer 320 is a semiconductor material and the second inorganic thin film material layer 330 is a dielectric material, and selectively depositing the second inorganic thin film material layer includes selectively depositing the second inorganic thin film material layer on the first inorganic thin film material layer after the first inorganic thin film material layer has been deposited on the substrate.

FIG. 11a is a cross-sectional diagram of one embodiment of a TFT 500 of the present invention, taken along the line A-A' of the plan view shown in FIG. 11b. The TFT 500 shown in FIGS. 11a and 11b is a bottom gate structure that is representative of any bottom gate TFT 500 where the gate 520 is in contact with the substrate, the first inorganic thin film dielectric layer 530 is in contact with the gate and the substrate, the second inorganic thin film dielectric layer 540 is in contact with the first inorganic thin film dielectric layer 530, and the semiconductor layer is in contact with the source/drain 580. As shown in FIG. 11b, on substrate 510, there is a gate 520 including a first electrically conductive layer stack. The substrate 510 can be any previously discussed substrate, and can contain a plurality of predefined layers. The gate has the conventionally accepted meaning, and is used to gate the current of the TFT. The first electrically conductive layer stack of the gate 520 can be a single conductive material, as shown in FIG. 11a, or can include any number of conductive material layers.

In order to keep the gate isolated from the source/drain electrode 580, a patterned inorganic thin film dielectric stack 550 is disposed between them. Patterned inorganic thin film dielectric stack 550 is made up of patterned first inorganic thin film dielectric material layer 530 and patterned second inorganic thin film dielectric material layer 540. The first inorganic thin film dielectric layer 530 has a first pattern and the second inorganic thin film dielectric layer 540 has a first pattern. As shown in FIG. 11b, the patterns of the first 530 and second 540 inorganic thin film dielectric material layers are the same pattern and have the same material composition. In alternative embodiments, the patterns of the first 530 and second 540 patterned inorganic thin film dielectric layers can be different, or the same but misaligned in the manufacturing process. Although the patterned first inorganic thin film dielectric material 530 and patterned second inorganic thin film dielectric material 540 have the same material composition, they do not have the same analytical signature as a single layer with a combined thickness of the same material. As discussed previously, a change in composition can be detected in the contact region using depth profiling techniques. When an intensity signal for an impurity or compositional species in a contact area between the first inorganic thin film dielectric material layer and the second inorganic thin film dielectric material layer differs by 50% or more when compared to the intensity signal outside of the contact region, it serves as a marker indicating that an inorganic dielectric layer is indeed a patterned inorganic thin film dielectric stack 550 and not a single layer of material.

The interface between the semiconductor and the dielectric is critical to the function of the TFT. Depending upon the manufacturing methods used to make the TFT, this interface may or may not be easily controlled. In TFTs that are formed by the combination of SAD and ALD, special care should be taken to insure that when changing between the dielectric pattern and the semiconductor pattern the interface is not disturbed by the removal of the deposition inhibiting material. As shown in FIG. 11a a patterned third inorganic thin film dielectric layer 560, also referred to as a buffer layer, is present in the device. The third patterned inorganic thin film dielectric layer 560 has a third pattern that is located within an area defined by at least one of the first and second patterns of the first 530 and second 540 inorganic thin film dielectric material layers. The patterned semiconductor layer 570 is in contact with and has the same pattern as the patterned third inorganic thin film dielectric material layer 560. The patterned third inorganic thin film dielectric material layer 560 can be a different material as the patterned inorganic thin film dielectric stack 550. The patterned third inorganic thin film dielectric material layer 560 can preferably be the same material as the patterned inorganic thin film dielectric stack 550. In this case the interface can be detected (as discussed above) by a change in the intensity signal of either an impurity or compositional species from the baseline signal of the patterned third inorganic thin film dielectric material layer 560 and the patterned second inorganic thin film dielectric material layer 540. A change in the intensity signal for an impurity or compositional of 50% or greater indicates that an inorganic dielectric layer is indeed a patterned inorganic thin film dielectric stack 550 and not a single layer of material.

FIGS. 11a and 11b show the relative location of the source/drain electrodes 580 on substrate 510. The source and drain have conventionally accepted meanings, and either electrode shown can be designated the source (or drain) as is required by the application or circuit. The source/drain 580 includes a second electrically conductive layer stack. As with the first electrically conductive stack, the second electrically conductive layer stack is a single conductive material, as shown in FIG. 11a, or can include any number of conductive material layers.

FIG. 12a is a cross-sectional diagram of another embodiment of a TFT 505 of the present invention, taken along the line A-A' of the plan view shown in FIG. 12b. The TFT 505 shown in FIGS. 12a and 12b is a top gate structure that is representative of any top gate TFT 505 where the source/drain 580 is in contact with the substrate, the semiconductor layer 570 is in contact with the source/drain 580 and the substrate 510, the second inorganic thin film dielectric layer 540 is in contact with the first inorganic thin film dielectric layer 530, and is in contact with the gate 520.

As shown in FIG. 12b, on substrate 510, there is a gate 520 including a first electrically conductive layer stack. The substrate 510 can be any previously discussed substrate, and can contain a plurality of predefined layers. The gate has the conventionally accepted meaning, and is used to gate the current of the TFT 505. The first electrically conductive layer stack of the gate 520 can be a single conductive material, as shown in FIG. 12a, or can include any number of conductive material layers.

In order to keep the gate isolated from the source/drain electrode 580, a patterned inorganic thin film dielectric stack 550 is disposed between them. Patterned inorganic thin film dielectric stack 550 is made up of patterned first inorganic thin film dielectric material layer 530 and patterned second inorganic thin film dielectric material layer 540. These layers should be easily understood from their descriptions in reference to FIGS. 11a and 11b.

As with the bottom gate TFT 500 of FIGS. 11a and 11b, the interface between the semiconductor and the dielectric is critical to the function of the top gate TFT 505. As shown in FIG. 12a a patterned third inorganic thin film dielectric layer 560, also referred to as a buffer layer, is present in this top gate TFT 505. The patterned semiconductor layer 570 is in contact with and has the same pattern as the patterned third inorganic thin film dielectric material layer 560. As shown in FIG. 12a, the patterned semiconductor layer 570 is in contact with substrate 510 in this top gate TFT 505. These layers should be understood from their descriptions with respect to FIGS. 11a and 11b.

FIGS. 12a and 12b show the relative location of the source/drain electrodes 580 on substrate 510. The source and drain have the conventionally accepted meaning, and either electrode shown can be designated the source (or drain) as is required by the application or circuit.

Figure 13A:
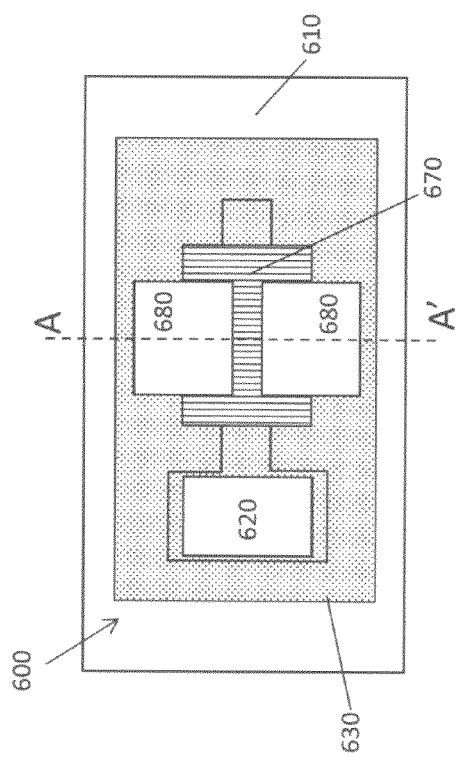
FIGS. 13a and 13b are cross-sectional views and plan views, respectively, of another embodiment of a thin film transistor of the present invention.
Figure 13B:
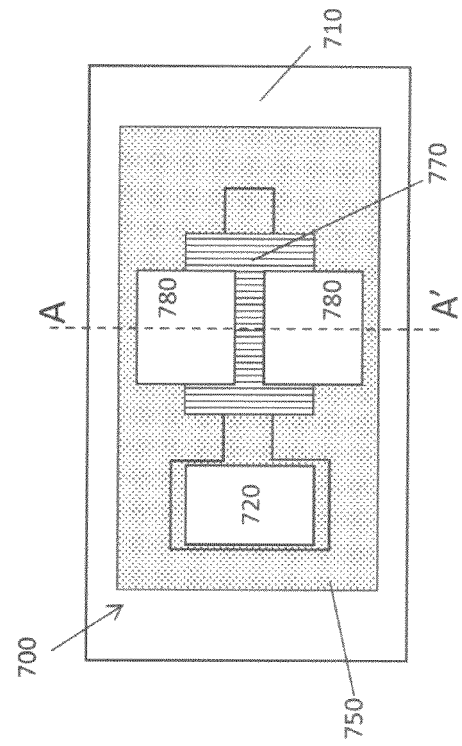

FIG. 13a is a cross-sectional diagram of another embodiment of a TFT 600 of the present invention, taken along the line A-A' of the plan view shown in FIG. 13b. The TFT 600 shown in FIGS. 13a and 13b is a bottom gate structure similar to that shown in FIGS. 11a and 11b. The TFT 600 of FIGS. 13a and 13b is illustrative of an embodiment of the present invention where the interface between the dielectric and semiconductor is controlled by a buffer layer, but uses a single layer of dielectric with sufficient quality. In this embodiment, TFT 600 has a gate 620 that is in contact with the substrate 610, a first inorganic thin film dielectric layer 630 is in contact with the gate and the substrate, a second inorganic thin film dielectric layer 660 is in contact with the first inorganic thin film dielectric layer 630, and a semiconductor layer 670 is in contact with the source/drain 680. TFT 600 shown in FIGS. 13a and 13b is a bottom gate structure, but it should be understood that transistors with a top gate structure composed of the same layers can be constructed and are considered an alternative embodiment of the present invention. Such a top gate TFT of the present invention has a source/drain 680 in contact with the substrate 610, semiconductor layer 670 that is in contact with the source/drain 680 and the substrate 610, a second inorganic thin film dielectric layer 660 that is in contact with the first inorganic thin film dielectric layer 630, and a first inorganic thin film dielectric layer 630 that is in contact with the gate 620.

As shown in FIG. 13b, on substrate 610, there is a gate 620 including a first electrically conductive layer stack. The substrate 610 can be any previously discussed substrate, and can contain a plurality of predefined layers. The gate has the conventionally accepted meaning, and is used to gate the current of the TFT. The first electrically conductive layer stack of the gate 620 can be a single conductive material, as shown in FIG. 13a, or can include any number of conductive material layers.

In order to keep the gate isolated from the source/drain electrode 680, a first patterned inorganic thin film dielectric layer 630 is disposed between them. The first inorganic thin film dielectric layer 630 has a first pattern as shown in FIGS. 13a and 13b. As previously discussed, the interface between the semiconductor and the dielectric is critical to the function of the TFT. FIGS. 13a and 13b shown a patterned second inorganic thin film dielectric layer 660, also referred to as a buffer layer located between the first patterned inorganic thin film dielectric layer 630 and the semiconductor layer 670. The second patterned inorganic thin film dielectric layer 670 has a second pattern that is located within an area defined by first pattern of the first inorganic thin film dielectric material layer 630.

As shown in FIG. 13a, the patterned semiconductor layer 670 is in contact with and has the same pattern as the patterned second inorganic thin film dielectric material layer 660. The patterned second inorganic thin film dielectric material layer 660 can be a different material than that of the first patterned inorganic thin film dielectric layer 630. The patterned second inorganic thin film dielectric material layer 660 is preferably the same material as the first patterned inorganic thin film dielectric layer 630. In this case the interface can be detected (as discussed above) by a change in the intensity signal of either an impurity or compositional species from the baseline signal of the patterned second inorganic thin film dielectric material layer 660 and the patterned first inorganic thin film dielectric material layer 630. A change in the intensity signal for an impurity or compositional species of 50% or greater indicates that an inorganic dielectric layer is made up of a first patterned inorganic thin film dielectric layer 630 and patterned second inorganic thin film dielectric material layer 660, and was not deposited as a single dielectric layer.

FIGS. 13a and 13b show the relative location of the source/drain electrodes 680 on substrate 610. The source and drain have the conventionally accepted meaning, and either electrode shown can be designated the source (or drain) as is required by the application or circuit. The source/drain 680 includes a second electrically conductive layer stack. As with the first electrically conductive stack, the second electrically conductive layer stack a single conductive material, as shown in FIG. 13a, or can include any number of conductive material layers.

Figure 14A:
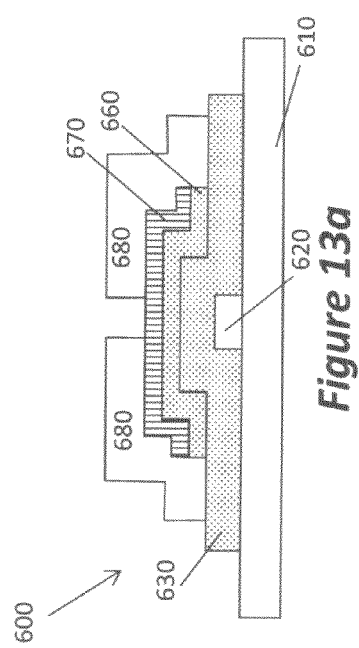
FIGS. 14a and 14b are cross-sectional views and plan views, respectively, of another embodiment of a thin film transistor of the present invention.
Figure 14B:
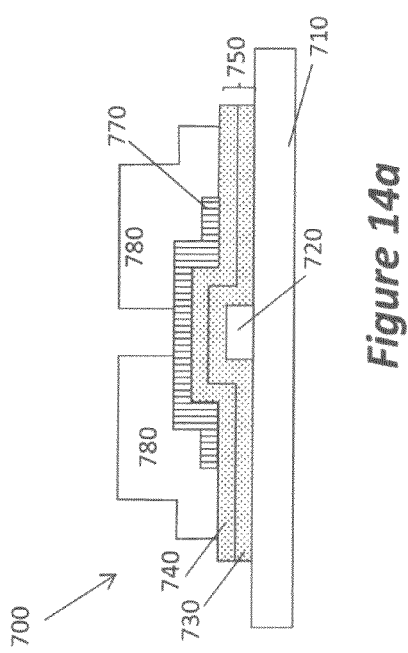

FIG. 14a is a cross-sectional diagram of another embodiment of a TFT 700 of the present invention, taken along the line A-A' of the plan view shown in FIG. 14b. The TFT 700 shown in FIGS. 14a and 14b is a bottom gate structure similar to that shown in FIGS. 11a and 11b. The TFT 700 of FIGS. 14a and 14b is illustrative of an embodiment of the present invention of where a buffer layer is not required to control the interface and a multilayer dielectric stack is used. In this embodiment, TFT 700 has a gate 720 is in contact with the substrate 710, a first inorganic thin film dielectric layer 730 that is in contact with the gate 720 and the substrate 710, a second inorganic thin film dielectric layer 740 that is in contact with the semiconductor layer 770, and a semiconductor layer 770 that is in contact with the source/drain 780. TFT 700 shown in FIGS. 14a and 14b is a bottom gate structure, but it should be understood that transistors with a top gate structure composed of the same layers can be constructed and are considered an alternative embodiment of the present invention. A top gate TFT of the present invention has a source/drain 780 that is in contact with the substrate 710, a semiconductor layer 770 that is in contact with the source/drain 780 and the substrate 710, a first inorganic thin film dielectric layer 730 is in contact with the semiconductor layer 770, and a second inorganic thin film dielectric layer 740 that is in contact with the gate.

As shown in FIG. 14b, on substrate 710, there is a gate 720 including a first electrically conductive layer stack. The substrate 710 can be any previously discussed substrate, and can contain a plurality of predefined layers. The gate has the conventionally accepted meaning, and is used to gate the current of the TFT. The first electrically conductive layer stack of the gate 720 can be a single conductive material, as shown in FIG. 14a, or can include any number of conductive material layers.

In order to keep the gate 720 isolated from the source/drain electrode 780, a patterned inorganic thin film dielectric stack 750 is disposed between them. Patterned inorganic thin film dielectric stack 750 is made up of patterned first inorganic thin film dielectric material layer 730 and patterned second inorganic thin film dielectric material layer 740. The first inorganic thin film dielectric layer 730 has a first pattern and the second inorganic thin film dielectric layer 740 has a second pattern. As shown in FIG. 14b, the patterns of the first 730 and second 740 inorganic thin film dielectric material layers are the same pattern and have the same material composition. In alternative embodiments, the patterns of the first 730 and second 740 patterned inorganic thin film dielectric layers be different, or the same but misaligned as a result of the manufacturing process. Although the patterned first inorganic thin film dielectric material 730 and patterned second inorganic thin film dielectric material 740 have the same material composition, they do not have the same analytical signature as a single layer with a combined thickness of the same material. As discussed previously, there is a change in the intensity signal of either an impurity or compositional species in the contact region when compared to a region of the first inorganic thin film dielectric material layer 730 and the second inorganic thin film dielectric material layer 740 that is outside of the contact region. This intensity change acts as a marker indicating that an inorganic dielectric layer is indeed a patterned inorganic thin film dielectric stack 750 and not a single layer of material. When an intensity signal for an impurity or compositional species in a contact area between the first inorganic thin film dielectric material layer 730 and the second inorganic thin film dielectric material layer 740 differs by 50% or more when compared to the intensity signal outside of the contact region, it serves as a marker indicating that the inorganic dielectric layer is not a single layer of material. The first inorganic thin film dielectric material layer 730 and the second inorganic thin film dielectric material layer each have an associated thickness, and as shown in FIG. 14a the thickness of the first inorganic thin film dielectric material layer 730 and the thickness of the second inorganic thin film dielectric material layer 740 are same. In alternative embodiments of the present inventions these film thickness can be different.

As shown in FIG. 14a, the patterned semiconductor layer 770 is in contact with the patterned second inorganic thin film dielectric material layer 740. The patterned semiconductor layer 770 has a third pattern and that third pattern is located within an area defined by first pattern of the first inorganic thin film dielectric material layer 730.

FIGS. 14a and 14b show the relative location of the source/drain electrodes 780 on substrate 710. The source and drain have the conventionally accepted meaning, and either electrode shown can be designated the source (or drain) as is required by the application or circuit. The source/drain 780 includes a second electrically conductive layer stack. As with the first electrically conductive stack, the second electrically conductive layer stack a single conductive material, as shown in FIG. 14a, or can include any number of conductive material layers.

EXAMPLES

Description of the Coating Apparatus

All of the following thin film examples employ a flow setup as indicated in FIG. 28. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, ammonia flow 90 is also delivered to the apparatus.

The following flows are delivered to the ALD coating apparatus: metal (zinc) precursor flow 92 containing metal precursors diluted in nitrogen gas; oxidizer-containing flow 93 containing non-metal precursors or oxidizers diluted in nitrogen gas; and nitrogen purge flow 95 composed only of the inert gas. The composition and flows of these streams are controlled as described below.

Gas bubbler 83 contains liquid dimethylaluminum isopropoxide (DMAI) and gas bubbler 82 contains diethyl zinc (DEZ). Flow meter 86 and flow meter 85 deliver flows of pure nitrogen to the bubblers. The output of the bubbler now contains nitrogen gas saturated with the respective precursor solution. The output flow is mixed with a nitrogen gas dilution flow delivered from flow meter 87 to yield the overall flow of metal precursor flow 92. In the following examples, the flows for the dielectric material are as follows:

Flow meter 86: To Dimethylaluminum isopropoxide Bubbler Flow

Flow meter 87: To Metal Precursor Dilution Flow

Gas bubbler 84 contains pure water at room temperature. Flow meter 88 delivers a flow of pure nitrogen to gas bubbler 84, the output of which represents a stream of saturated water vapor. An ammonia flow is controlled by flow meter 91. The water bubbler output and air streams are mixed with dilution stream from flow meter 89 to produce the overall flow of oxidizer-containing flow 93 which has a variable water vapor composition, nitrogen composition, and total flow. In the following examples, the flows are as follows:

Flow meter 88: To Water Bubbler

Flow meter 89: Oxidizer Dilution Flow

Flow meter 91: Ammonia Flow

Figure 29:
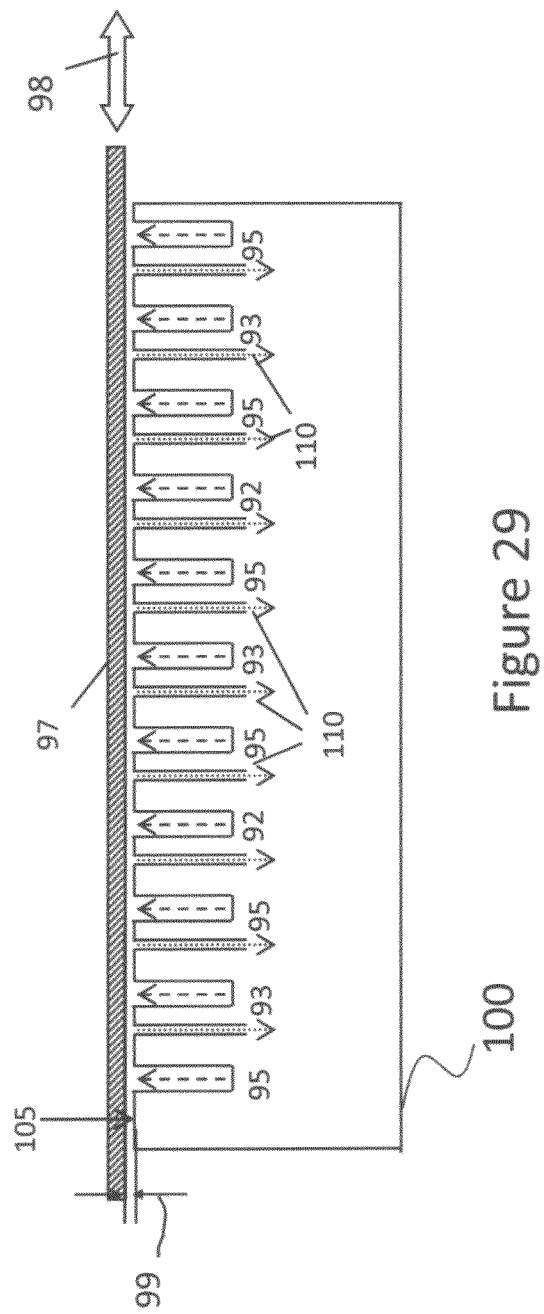
FIG. 29 is a cross-sectional side view of a deposition device, used in the process of FIG. 28, showing the arrangement of gaseous materials provided to a substrate that is subject to the thin film deposition process of the Examples.

Flow meter 94 controls the flow of pure nitrogen that is to be delivered to the coating apparatus. Streams or Flows 92, 93, and 95 are then delivered to an atmospheric pressure coating head where they are directed out of the channels or microchamber slots as indicated in FIG. 29. A gap 99 exists between the elongated channels and the substrate 97. Substrate 97 is maintained in close proximity to the output face 105 by an equilibrium between the flow of the gases supplied to the output face and a slight amount of vacuum produced at the exhaust slot.

In order to perform a deposition, the delivery head 100 is positioned over a portion of the substrate 97 and then moved in a reciprocating fashion over the substrate 97, as represented by the arrow 98. The length of the reciprocation cycle was 32 mm. The rate of motion of the reciprocation cycle was varied as a deposition parameter.

Materials Used:

(1) Glass substrates, cut to 2.5×2.5" squares, previously cleaned in Piranha solution, washed with distilled water, reagent ethanol and dried.

(2) Dimethylaluminum isopropoxide (DMAI) (commercially available from Strem Chemical Co.).

(3) Diethylzinc (DEZ) (commercially available from Strem Chemical Co.).

(4) Polyvinylpirolidone (PVP) k-30 (commercially available from Acros Organics).

General Conditions for the Preparation of Layers Using Atmospheric Pressure ALD

This describes the preparation of a thin film coating of the material layers on glass substrates as used in the examples. The ALD coating device used to prepare these layers, namely $Al_2O_3$, ZnO:N, and Al-doped ZnO (AZO), has been described in detail in US Patent Application Publication No. US 2009/0130858, the disclosure of which is incorporated by reference herein in its entirety. The coating device has an output face 105 (facing up as shown in FIG. 29) that contains spatially separated elongated gas channels and operates on a gas bearing principle. Each gas channel is composed of an output slot 95, 93, 92 which supplies gas to the output face 105, and adjacent exhaust slots 110 which remove gas from the output face 105. The order of the gas channels is P-O-P-M-P-O-P-M-P-O-P where P represents a purge channel, O represents a channel containing an oxygen based precursor, and M represents a channel containing a metal based precursor. As a substrate moves relative to the coating head it sees the above sequence of gases which effects and ALD deposition.

A 2.5×2.5 inch square (62.5 mm square) substrate 97, attached to a heated backer, is positioned on the output face of the coating device and is maintained in close proximity to the output face by an equilibrium between the flow of the gases supplied to the output face and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally ammonia vapor. The metal reactive precursor M is one or a mixture of active metal alkyls vapor in nitrogen.

The metal alkyl precursors used in these examples were dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through and mass flow controller and mixing with the water vapor stream. All bubblers were maintained at 22 C. The temperature of the coating was established by controlling heating both the coating device and the backer to a desired temperature. Experimentally, the flow rates of the individual gasses were adjusted to the settings shown in Table 1 for each of the material layers coated in the examples contained herein. The flows shown are the total flows supplied to the coating device, and thus are partitioned equally among the individual gas channels.

The coating process was then initiated by oscillating 98 the coating head across the substrate for the number of cycles necessary to obtain a uniform deposited film of the desired thickness for the given example. Due to the fact that the coating head as described above contains two full ALD cycles (two oxygen and two metal exposures per single direction pass over the head), a round trip oscillation represents 4 ALD cycles.

bottom conductor was grounded. A detailed description of the samples and their respective testing conditions follows.

Comparative Example C1

Cross-Over with Single Layer of Dielectric

A glass substrate was prepared to have a conductor-dielectric-conductor structure using the equipment described above. Prior to depositing the first thin film conductor, an aluminum stripe was deposited by evaporation through a shadow mask such that there was a aluminum stripe along one edge of the sample that extended beyond the ALD area to allow for easy access to probe the bottom conductor. 1000 Å of AZO was then deposited on the clean glass substrate having the aluminum stripe, at 250 C and using 684 ALD cycles at the conditions listed for AZO in Table 1 on the Atmospheric ALD equipment described above. Next, 520 Å of $Al_2O_3$ was deposited in a single coating event at 200° C., using the conditions listed for $Al_2O_3$ in Table 1 and 1856 ALD cycles each with a 50 ms residence time on the Atmospheric ALD equipment described above. The substrate was then cleaned using 2 minutes of exposure to $O_2$ plasma, and a pattern of inhibitor ink was applied using a Fuji Dimatix 2500 piezo-inkjet printer. The inhibitor ink was a 2 wt % solution of PVP k-30 in diacetone alcohol, and the pattern printed was a regular grid of 350 μm by 350 μm openings on 700 μm centers. Following the patterning of the inhibitor, the substrate was returned to the Atmospheric ALD equipment and a second layer of 1000 Å of AZO was first deposited as the first, at 250 C and using 684 ALD cycles. Due to the presence of the PVP inhibitor, the AZO only deposited in the open areas of the pattern where the PVP was not present, forming a 12×73 grid of cross-over devices. The sample was then subjected to a 2 minute $O_2$ plasma treatment to remove the PVP inhibitor. Testing of the cross-over was accomplished by using a probe station to contact the aluminum stripe for the bottom contact and the patterned AZO, results can be found in Table 2.

Inventive Example I1

Cross-Over with Two Layer Dielectric, with an $O_2$ Plasma at the Interface

Inventive example I1, was prepared as comparative example C1 with the following exception. Instead of depos-

TABLE 1

| Layer | DMAI bubbler flow (sccm) | DEZ bubbler flow (sccm) | NH3 flow (sccm) | Water bubbler flow (sccm) | $N_2$ dilution with Metal Alkyl (sccm) | $N_2$ dilution with water (sccm) | $N_2$ Inert Purge (sccm) | Residence Time (ms) | Substrate Temperature, ° C. |
|---|---|---|---|---|---|---|---|---|---|
| $Al_2O_3$ | 65 | 0 | 0 | 65 | 1500 | 2250 | 3000 | 100 or 50 | 200 |
| ZnO:N | 0 | 60 | 4 | 45 | 1500 | 2250 | 3000 | 50 | 200 |
| AZO | 10 | 30 | 0 | 22.5 | 1500 | 2250 | 3000 | 50 | 200 or 250 |

Cross-Over Experiments to Probe Dielectric Quality

In order to probe the quality of the dielectric layer, a number of experiments were run. The simplest experiments were conductor-dielectric-conductor structures, with each sample substrate having a large number of devices. These samples were evaluated for % yield, where % yield is defined as the percentage of devices that were not dead shorts, and break-down voltage, where the break-down voltage is defined as the voltage required for 5 nA of current. To obtain these values, the voltage on the pattered top conductor was swept, while the iting 520 Å of $Al_2O_3$ in a single coating event, the dielectric layer was divided into two layers. Experimentally, 260 Å of $Al_2O_3$ was deposited at 200° C., using the conditions listed for $Al_2O_3$ in Table 1 and 928 ALD cycles each with a 50 ms residence time on the Atmospheric ALD equipment described above. Next the sample was subjected to a 2 minute $O_2$ plasma treatment to clean the interface between the two layers of $Al_2O_3$ and reset the surface. After the $O_2$ plasma, another 260 Å of $Al_2O_3$ was deposited using the same conditions as the first layer. The sample was completed and tested as in comparative example C1, results can be found in Table 2.

Inventive Example I2

Cross-Over with Two Layer Dielectric, with an Ambient Hold Treatment at the Interface Inventive example I2, was prepared as inventive example I1 with the following exception. Instead of treating the interface with $O_2$ plasma, the sample was instead held for 5 minutes at ambient lab conditions, nominally treating the sample surface to equilibrate in a higher humidity environment and reset the surface or the $Al_2O_3$. After the ambient treatment, another 260 Å of $Al_2O_3$ was deposited using the same conditions as the first layer. The sample was completed and tested as in comparative example C1, results can be found in Table 2.

Inventive Example I3

Cross-Over with Two Layer Dielectric, with UV-Ozone Cleaning at the Interface Inventive example I3, was prepared as inventive example I1 with the following exception. Instead of treating the interface with $O_2$ plasma, the sample was instead subjected to a 15 minute UV-ozone clean. After the ambient treatment, another 260 Å of $Al_2O_3$ was deposited using the same conditions as the first layer. The sample was completed and tested as in comparative example C1, results can be found in Table 2.

TABLE 2

| Sample | Dielectric Layer Details | Number of devices tested | Number bad devices | Break-Down Voltage | % Yield |
| --- | --- | --- | --- | --- | --- |
| C1 | Single Layer | 1241 | 166 | 20.6 | 86.6 |
| I1 | Double layer with $O_2$ plasma treatment at interface | 1241 | 44 | 20.6 | 96.5 |
| I2 | Double layer with ambient hold treatment at interface | 1241 | 72 | 21.4 | 94.2 |
| I3 | Double layer with UV-ozone treatment at interface | 1241 | 112 | 21.0 | 91 |

As can be seen in Table 2, all inventive samples I1 through I2 had higher yield than the comparative example C2. As seen in Table 2, inventive sample I1 with an $O_2$ plasma at the interface gave the biggest yield improvement, and as such is one of the preferred embodiments of the preset invention.

Comparative Example C2

Cross-Over with Single Layer of Dielectric

Comparative example C2, was prepared as comparative example C1 with the following exception. Instead of depositing 520 Å of $Al_2O_3$, 800 Å was deposited in a single coating event. This was done experimentally at 200° C. by using the conditions listed for $Al_2O_3$ in Table 1 and 1856 ALD cycles each with a 100 ms residence time on the Atmospheric ALD equipment described above. Next the sample was subjected to a 2 minute $O_2$ plasma treatment to clean the interface between the two layers of $Al_2O_3$ and reset the surface. After the $O_2$ plasma, another 260 Å of $Al_2O_3$ was deposited using the same conditions as the first layer. The sample was completed and tested as in comparative example C1, results can be found in Table 3.

Inventive Example I4

Cross-Over with Two Layer Dielectric, with an $O_2$ Plasma at the Interface Inventive example I4, was prepared as comparative example C2 with the following exception. Instead of depositing 800 Å of $Al_2O_3$ in a single coating event, the dielectric layer was divided into two layers. Experimentally, 400 Å of $Al_2O_3$ was deposited at 200° C., using the conditions listed for $Al_2O_3$ in Table 1 and 928 ALD cycles each with a 100 ms residence time on the Atmospheric ALD equipment described above. Next the sample was subjected to a 2 minute $O_2$ plasma treatment to clean the interface between the two layers of $Al_2O_3$ and reset the surface. After the $O_2$ plasma, another 400 Å of $Al_2O_3$ was deposited using the same conditions as the first layer. The sample was completed and tested as in comparative example C2, results can be found in Table 3.

Inventive Example I5-I9

Cross-Over with Multi Layer Dielectric, $O_2$ Plasma at the Interface(s)

Inventive examples I5 through I9 were prepared as I4, only instead of dividing the 800 Å of $Al_2O_3$ equally into two layers, the dielectric was divided in various ways—with each sample receiving a 2 minute $O_2$ plasma treatment at the interface between subsequent layers of $Al_2O_3$ to clean and reset the surface. The details of inventive samples I5-I9 can be found in Table 3, along with the results of the electrical testing. Sample I9 had less devices printed, and therefore less devices tested, however statistical comparison should still be valid.

TABLE 3

| Sample | Dielectric Layer Details | Number of devices tested | Number bad devices | Break-Down Voltage | % Yield |
| --- | --- | --- | --- | --- | --- |
| C2 | Single Layer | 1241 | 1026 | 27 | 17.3 |
| I4 | Double layer (400 Å/400 Å) with $O_2$ plasma treatment at interface | 1241 | 57 | 30 | 95.4 |
| I5 | Double layer (100 Å/700 Å) with $O_2$ plasma treatment at interface | 1241 | 22 | 32 | 98.2 |
| I6 | Double layer (700 Å/100 Å) with $O_2$ plasma treatment at interface | 1241 | 54 | 28 | 95.6 |
| I7 | Triple layer (266 Å/267 Å/267 Å) with $O_2$ plasma treatment at interfaces | 1241 | 47 | 31 | 96.2 |
| I8 | Triple layer (100 Å/600 Å/100 Å) with $O_2$ plasma treatment at interfaces | 1241 | 59 | 32 | 95.2 |

TABLE 3-continued

| Sample | Dielectric Layer Details | Number of devices tested | Number bad devices | Break-Down Voltage | % Yield |
|---|---|---|---|---|---|
| I9 | Quadruple layer (200 Å/200 Å/200 Å/200 Å) with $O_2$ plasma treatment at interfaces | 876 | 14 | 32 | 98.4 |

As can be seen in Table 3, all inventive samples I4 through I9 had a significantly higher yield than the comparative example C2. All samples were run in spatial ALD equipment that was located in a standard chemical hood, in a non-clean room environment. While the data shows no statistical improvement in the yield between the embodiments of the inventive samples under the conditions run, the data does suggest that having a thin layer nearest to the ground electrode can be preferred.

Comparative Example C3

Single Layer Dielectric on a Glass Substrate

Comparative example C3, was prepared in order facilitate analysis of a dielectric layer composition through time-of-flight secondary ion mass spectroscopy (ToF SIMS). Experimentally, a clean glass substrate was coated with 800 Å of $Al_2O_3$ in a single coating event at 200° C., using the conditions listed for $Al_2O_3$ in Table 1 and 1856 ALD cycles each with a 100 ms residence time on the Atmospheric ALD equipment described above. The dielectric layer of comparative example C3 is equivalent to that of comparative example C2. Positive-ion SIMS depth profiles of the sample were obtained using an ION TOF IV ToF-SIMS instrument. An Argon-ion gun (40 nA at 3 keV and 10 s/cycle) was used to sputter a 225 μm by 225 μm area on the sample. Between each sputter cycle a 75 μm by 75 μm area co-centered within the sputtered area was then analyzed using a pulsed $Bi_3^+$ liquid metal ion gun (0.3 pA at 25 keV). To enhance the signals for metal ions and to help with stabilizing the sample surface charge an $O_2$ gas flood was directed at the sample and adjusted until a steady pressure of $10^{-6}$ mBar was measured in the analysis chamber. Four species from the positive analysis (AlF, B, AlOH and Si) were selected to illustrate the types of ToF SIMS signatures that can be found when analyzing single layer and multilayer dielectric materials. For each species, the number of peaks was counted and the average percent change in intensity from peak to valley was calculated. This calculation was constrained to exclude species at the top surface and at the interface with the substrate (the interface of the substrate is clearly identifiable by a substantial change in composition). Additionally, the percent change in intensity was only calculated when a peak was detected. The percent change in peak intensity can be positive or negative. In this analysis only the relative magnitude of the change is reported. The results of the number of peaks counted and the average percent change in the ToF SIMS can be found in Table 5. FIG. 30 contains the data for the AlF and AlOH signals of comparative example C3 that were used to calculate the values in Table 5 for those species.

Inventive Example I10

Four Layer Dielectric on a Glass Substrate

Inventive example I10, was prepared as comparative example C3 with the following exception. Instead of depositing 800 Å of $Al_2O_3$ in a single coating event, the dielectric layer was divided into four layers. Experimentally, 200 Å of $Al_2O_3$ was deposited at 200° C., using the conditions listed for $Al_2O_3$ in Table 1 and 928 ALD cycles each with a 100 ms residence time on the Atmospheric ALD equipment described above. Next the sample was subjected to a 2 minute 100 W 0.3 Torr $O_2$ plasma treatment to clean the interface between the two layers of $Al_2O_3$ and reset the surface. After the $O_2$ plasma, another 200 Å of $Al_2O_3$ was deposited using the same conditions as the first layer. This was repeated twice more until the overall layer thickness was 800 Å. The dielectric layer of comparative example I10 has interlayer interfaces that are equivalent to those of inventive example I4. Inventive example I10 was analyzed as described in comparative example C3, with the addition of three species selected from negative ion analysis ($AlO_2$, F, and CN) to further illustrate the types of ToF SIMS signatures that can be found when analyzing multilayer dielectric materials. The results of the number of peaks counted and average percent change in the ToF SIMS can be found in Table 5. FIG. 30 contains the data for the AlF and AlOH signals of inventive example I10 that were used to calculate the values in Table 5 for those species.

Inventive Example I11

Four Layer Dielectric on a Silicon Substrate

Inventive example I11, was prepared as inventive example I10 with the exception that the sample was coated onto clean silicon substrate instead of a glass substrate. Inventive example I11 was analyzed as described in inventive example I10. The results of the number of peaks counted and average percent change in the ToF SIMS can be found in Table 5.

Inventive Example I12

Four Layer Dielectric on a Glass Substrate

Inventive example I12, was prepared as inventive example I10 with the following exceptions. Instead of subjecting the sample to a 2 minute 100 W 0.3 Torr $O_2$ plasma treatment to clean the interface between the two layers of $Al_2O_3$ and reset the surface, a different $O_2$ plasma unit was used to treat the surface with a lower power $O_2$ plasma (when compared inventive example I10) to clean the interface. Inventive example I12 was analyzed as described in inventive example I10. The results of the number of peaks counted and average percent change in the ToF SIMS can be found in Table 5.

TABLE 5

| Analysis Polarity | Species | C3 | | I10 | | I11 | | I12 | |
|---|---|---|---|---|---|---|---|---|---|
| | | # Peaks | % Inten. change | # Peaks | % Inten. change | # Peaks | % Inten. change | # Peaks | % Inten. change |
| Positive | AlF | 0 | n/a | 3 | 10841 | 3 | 1334 | 3 | 1548 |
| Positive | B | 0 | n/a | 3 | 3500 | 3 | 80196 | 3 | 23987 |
| Positive | AlOH | 0 | n/a | 3 | 60 | 0 | n/a | 0 | n/a |
| Positive | Si | 0 | n/a | 3 | 790 | 3 | 1714 | 3 | 1547 |
| Negative | AlO$_2$ | | | 3 | 57 | 0 | n/a | 0 | n/a |
| Negative | F | | | 3 | 5926 | 3 | 1408 | 3 | 1337 |
| Negative | CN | | | 3 | 225 | 3 | 858 | 3 | 1130 |

As can be seen from FIG. 30 and Table 5, the interface between inorganic dielectric material layers of the same material can be easily detected by standard analytical techniques. The ToF SIMS data clearly shows that dielectric multilayer stacks of the present invention can have species with an intensity change of 50% or greater at an interface when compared to the intensity that is detected in a bulk film. Many species are potential markers for treatment at the interface; although the interface signature is different for different samples and techniques the presence of an intensity change of 50% or greater in one or more species is common between inventive examples I10, I11 and I12. Additionally, without constraining the magnitude of the signal change, one can see that the simple presence of peaks within the intensity trace as a function of depth is indicative of the presence of treatment at a material interface.

TFT Experiments to Probe Dielectric Quality

In order to further probe the impact of the dielectric layer quality and to evaluate the importance of the dielectric semiconductor interface TFTs were built according to the process flow illustrated in FIGS. 15-27.

FIG. 15a is a cross-sectional diagram the first processing Step of one embodiment of a TFT 500 of the present invention, taken along the line A-A' of the plan view shown in FIG. 15b. As shown, a substrate 510 is provided having prepatterned gate 520. In the Example TFTs of the present invention the gate 520 was provided using the combination of SAD and ALD, providing a gate having 1000 Å of AZO as the conductive material stack.

A first patterned deposition inhibiting material layer 810 is also provided on substrate 510 as shown in FIGS. 15a and 15b, and contains regions 820 where the deposition inhibiting material layer is not present. In the Examples contained herein the first patterned deposition inhibiting material layer 810 was applied using a Fuji Dimatix 2500 piezo-inkjet printer. The inhibitor ink was a 2 wt % solution of PVP k-30 in diacetone alcohol. The pattern of the first patterned deposition inhibiting material layer 810 provides a via to the pad of the TFT gate 520.

Next, as shown in FIGS. 16a and 16b, a patterned first inorganic thin film dielectric layer 530 is obtained by selectively depositing an inorganic dielectric material the region 820 of the substrate where the first deposition inhibiting material layer is not present using an atomic layer deposition process. The patterned first inorganic thin film dielectric layer 530 covers the gate 520 of the TFT, and can be of any pattern that has this feature. In the present examples, a given thickness of Al$_2$O$_3$ was deposited at 200° C., using the conditions listed for Al$_2$O$_3$ in Table 1. Following the selective deposition of the patterned first inorganic thin film dielectric layer 530, the first patterned deposition inhibiting material layer 810 is removed by simultaneously treating the first deposition inhibiting material layer 810 and the first inorganic thin film dielectric material layer 530. The resultant structure of the simultaneous treatment is shown in FIGS. 17a and 17b. This treatment is preferably an O$_2$ plasma, and the examples TFTs of the present invention were subjected to a 2 minute O$_2$ plasma at 100 W and 0.3 Torr.

For inventive examples containing a multilayer dielectric stack, a second patterned deposition inhibiting material layer 830 is provided on substrate 510 as shown in FIGS. 18a and 18b. Preferably, the second patterned deposition inhibiting material layer 830 is provided using the same method as the first patterned deposition inhibiting material layer 810, and has the same pattern as the first patterned deposition inhibiting layer 810. All patterned deposition inhibiting material layers of following examples were applied using a Fuji Dimatix 2500 piezo-inkjet printer and an inhibitor ink was a 2 wt % solution of PVP k-30 in diacetone alcohol as the inhibitor ink.

Next, as shown in FIGS. 19a and 19b, a patterned second inorganic thin film dielectric layer 540 is obtained by selectively depositing an inorganic dielectric material the region 840 of the substrate where the second deposition inhibiting material layer is not present using an atomic layer deposition process. The second patterned inorganic thin film dielectric layer 540 as shown preferably has the same pattern as the first patterned inorganic thin film dielectric layer 530. Patterned inorganic thin film dielectric stack 550 as shown is made up of patterned first inorganic thin film dielectric material layer 530 and patterned second inorganic thin film dielectric material layer 540. In the present examples, a given thickness of Al$_2$O$_3$ was deposited at 200° C., using the conditions listed for Al$_2$O$_3$ in Table 1 for patterned second inorganic thin film dielectric layer 540. Following the selective deposition of the second patterned inorganic thin film dielectric layer 540, the second patterned deposition inhibiting material layer 830 is removed by simultaneously treating the second deposition inhibiting material layer 830 and the second inorganic thin film dielectric material layer 540. The resultant structure of the simultaneous treatment is shown in FIGS. 20a and 20b. This treatment is preferably an O$_2$ plasma, and the examples TFTs of the present invention were subjected to a 2 minute O$_2$ plasma at 100 W and 0.3 Torr. It should be understood that comparative TFT examples C4, C5 and C6 of the present invention, and inventive examples I11 and I13 containing a single layer dielectric, have only the first inorganic thin film dielectric material layer 530 in place of the patterned inorganic thin film dielectric stack 550. In these examples, the steps described in relationship to FIGS. 18a-20b were omitted.

Next, as shown in FIGS. 21a and 21b, a third patterned deposition inhibiting material layer 850 is provides on substrate 510 and contains regions 860 where the deposition inhibiting material layer is not present. Preferably, the third patterned deposition inhibiting material layer 850 is provided using the same method as the first patterned deposition inhibiting material layer 810. As discussed previously, all patterned deposition inhibiting material layers of the Examples were applied using a Fuji Dimatix 2500 piezo-inkjet printer and a 2 wt % solution of PVP k-30 in diacetone alcohol as the inhibitor ink.

Next, for inventive examples I11 through I15 and comparative example C6, a buffer layer was deposited via selective area deposition as shown in FIGS. 22a and 22b. As shown in FIGS. 22a and 22b a patterned third inorganic thin film dielectric layer 560, also referred to as a buffer layer, is obtained by selectively depositing an inorganic dielectric material in the region 860 of the substrate where the third deposition inhibiting material layer is not present using an atomic layer deposition process. In the present Examples, 250 Å of $Al_2O_3$ was deposited at 200° C., using the conditions listed for $Al_2O_3$ in Table 1 for patterned third inorganic thin film dielectric layer 560. As shown, the third patterned inorganic thin film dielectric layer 560 has a third pattern that is located within an area defined by at least one of the first and second patterns of the first 530 and second 540 inorganic thin film dielectric material layers. For comparative examples C3 and C4 this Step was omitted.

In TFTs that are formed by the combination of SAD and ALD, special care should be taken to insure that when changing between the dielectric pattern and the semiconductor pattern that the interface is not disturbed by the removal of the deposition inhibiting material. To this end, for inventive examples I11, I12, I15 and I16, a pattern semiconductor layer 570 was deposited via selective area deposition as shown in FIGS. 23a and 23b. As shown in FIGS. 23a and 23b the pattern semiconductor layer 570, is obtained by selectively depositing an inorganic semiconductor material the region 860 of the substrate where the third deposition inhibiting material layer is not present using an atomic layer deposition process. In the present Examples, nitrogen doped zinc oxide (ZnO:N) was deposited as the semiconductor layer at 200° C., using the conditions listed for ZnO:N in Table 1. As shown, the patterned semiconductor layer 570 has the same pattern as the patterned third inorganic thin film dielectric layer 850 and was also selectively deposited using the third patterned deposition inhibiting material layer 850. For comparative example C6 and inventive example I13, the patterned deposition inhibitor material 850 was removed with an $O_2$ plasma and then reapplied prior to selectively depositing the patterned semiconductor layer 570.

Figure 24B:
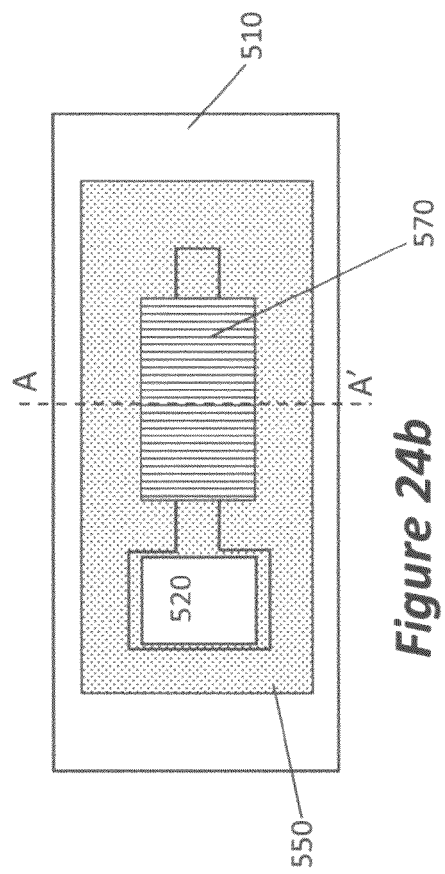
Figure 24A:
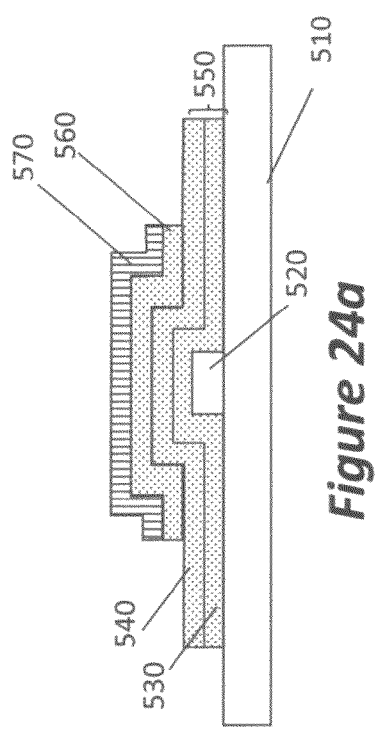

Following the selective deposition of the patterned semiconductor layer 570, the third patterned deposition inhibiting material layer 850 is removed by treating the substrate with an $O_2$ plasma. The Example TFTs of the present invention were subjected to a 2 minute $O_2$ plasma at 100 W and 0.3 Torr. The resultant structure is shown in FIGS. 24a and 24b.

Next, as shown in FIGS. 25a and 25b, a fourth patterned deposition inhibiting material layer 870 is provided on substrate 510 and contains regions 880 where the deposition inhibiting material layer is not present. Preferably, the fourth patterned deposition inhibiting material layer 870 is provided using the same method as the first patterned deposition inhibiting material layer 810. As discussed previously, all patterned deposition inhibiting material layers of the Examples were applied using a Fuji Dimatix 2500 piezo-inkjet printer and a 2 wt % solution of PVP k-30 in diacetone alcohol as the inhibitor ink.

Next, all Examples had the source/drain 580 formed on the substrate 510 by the selective area deposition of a second electrically conductive layer stack. As shown in FIGS. 26a and 26b, the source/drain 580 is obtained by selectively depositing a conductive inorganic material in the region 880 of the substrate where the fourth deposition inhibiting material layer is not present using an atomic layer deposition process. In the present Examples, 1000 Å of AZO was deposited at 200° C., using the conditions listed for AZO in Table 1 as the source/drain 580. For the Examples of the present invention, the fourth patterned deposition inhibiting material layer 870 was not removed prior to testing the device. FIGS. 27a and 27b are illustrative of a TFT after the removal of the fourth patterned deposition inhibiting material layer 870, and are essentially same as FIGS. 11a and 11b and should be understood from the previous descriptions.

The Example TFTs were fabricated using the method described above in relationship to FIGS. 15a through 27b. The relative differences between the samples are called out in the following descriptions for clarity. In all Examples, 133 transistors were tested. Each transistor had a characteristic channel width and length of 70 microns and 400 microns respectively. Electrical testing of the transistors was accomplished by using a probe station to contact the AZO gate and source/drain. The transistors were swept in the linear regime, with the drain being held constant at 0.2V (Vd=0.2), and the gate voltage was swept from −10 V to 20 V. The mobility (Mob.), threshold voltage (Vth), on-off ratio of the drain current (Ion/Ioff), the average gate leakage current at the maximum gate voltage applied (Ig(Vgmax)), and the % yield were all evaluated for the Examples below and reported in Tables 5 and 6.

Comparative Example C4

TFT with Single Layer Dielectric and No Buffer Layer on a Glass Substrate

Comparative example C4, was prepared generally as described above. However, comparative example C4 has a single layer inorganic dielectric material layer that is 750 Å thick that was obtained experimentally in a single coating event at 200° C., using the conditions listed for $Al_2O_3$ in Table 1 and 1740 ALD cycles each with a 100 ms residence time on the Atmospheric ALD equipment described above. Additionally, comparative example C4 does not contain a buffer layer. The sample was analyzed by using a probe station to contact the AZO gate and source/drain, and the results of this testing can be found in Table 6.

Inventive Example I13

TFT with Single Layer Dielectric and Buffer Layer on a Glass Substrate

Inventive example I13, was prepared as comparative example C4 with the following exception. Instead of depositing 750 Å of $Al_2O_3$ in a single coating event, the dielectric layer was divided into two layers. Experimentally, after printing the inhibitor dielectric pattern, 500 Å of $Al_2O_3$ was deposited at 200° C., using the conditions listed for $Al_2O_3$ in Table 1 and 1164 ALD cycles each with a 100 ms residence time on the Atmospheric ALD equipment described above. Next the sample was subjected to a 2 minute $O_2$ plasma treatment to remove the inhibitor and clean the interface between the two layers of $Al_2O_3$. Next, the semiconductor inhibitor pattern was printed and 250 Å of $Al_2O_3$ was deposited at 200° C., using the conditions listed for $Al_2O_3$ in Table 1 and 582 ALD cycles each with a 100 ms residence time on the Atmospheric ALD equipment described above. The sample was removed from the Atmospheric ALD equipment to facilitate the switch to ZnO deposition. The sample was then reloaded into the equipment without any surface modification and 300 Å of N-doped ZnO was deposited at 200° C., using the conditions listed for ZnO:N in Table 1 and 30 ALD cycles each with a 50 ms residence time. The sample was then completed as comparative example C4 and analyzed. The results of this testing can be found in Table 6.

Inventive Example I14

TFT with Double Layer Dielectric and Buffer Layer on a Glass Substrate

Inventive example I14, was prepared as comparative example C4 with the following exceptions. Instead of depositing 750 Å of $Al_2O_3$ in a single coating event, the dielectric layer was divided into two layers as described in relationship to FIGS. 15a through 20b. Experimentally, after printing the inhibitor dielectric pattern, 250 Å of $Al_2O_3$ was deposited at 200° C., using the conditions listed for $Al_2O_3$ in Table 1 and 582 ALD cycles each with a 100 ms residence time on the Atmospheric ALD equipment described above. Next the sample was subjected to a 2 minute $O_2$ plasma treatment to remove the inhibitor and clean the interface between the two layers of $Al_2O_3$. Next, the inhibitor dielectric pattern was printed again and 250 Å of $Al_2O_3$ using the same conditions as the first dielectric layer. Next the sample was subjected to a 2 minute $O_2$ plasma treatment to remove the inhibitor and clean the interface. Next, the semiconductor inhibitor pattern was printed and 250 Å of $Al_2O_3$ was deposited at 200° C., using the using the same conditions as the first dielectric layer. The sample was then removed from the Atmospheric ALD equipment to facilitate the switch to ZnO deposition. The sample was then reloaded into the equipment without any surface modification and 300 Å of N-doped ZnO was deposited at 200° C., using the conditions listed for ZnO:N in Table 1 and 30 ALD cycles each with a 50 ms residence time. The sample was then completed as comparative example C4 and analyzed. The results of this testing can be found in Table 6.

As can be seen in Table 6, inventive samples I13 and I14 have significantly higher average mobility values than the comparative example C4. This higher mobility can be attributed to the care taken at the interface of the semiconductor and dielectric. In these Examples, the semiconductor and third dielectric layer (buffer layer) were patterned using the same patterned director inhibitor material alleviating the need to clean the sample surface prior to the deposition of the semiconductor. Inventive example I14 also exhibits a significantly higher yield than C4. This can be attributed to the robustness of the multilayer dielectric stack.

Comparative Example C5

TFT with Single Layer Dielectric and No Buffer Layer on a Glass Substrate

Comparative example C5, was prepared as comparative example C4. The sample was analyzed by using a probe station to contact the AZO gate and source/drain., and the results of this testing can be found in Table 7.

Inventive Example I15

TFT with Single Layer Dielectric and Buffer Layer on a Glass Substrate

Inventive example I15, was prepared as inventive example I13. The sample was then completed as comparative example C4 and analyzed. The results of this testing can be found in Table 7.

Comparative Example C6

TFT with Single Layer Dielectric and Buffer Layer on a Glass Substrate

Comparative example C6, was prepared as inventive example I15 with the following exceptions. After deposition the second dielectric layer (the buffer layer), the sample was subjected to a 2 minute $O_2$ plasma treatment to remove the inhibitor and clean the interface. Next, the inhibitor semiconductor pattern was printed again and 300 Å of N-doped ZnO was deposited at 200° C., using the conditions listed for ZnO:N in Table 1 and 30 ALD cycles each with a 50 ms residence time. The sample was then completed as comparative example C4 and analyzed. The results of this testing can be found in Table 7.

Inventive Example I16

TFT with Double Layer Dielectric and Buffer Layer on a Glass Substrate

Inventive example I16, was prepared as inventive example I14. The sample was then completed as comparative example C4 and analyzed. The results of this testing can be found in Table 7.

TABLE 6

| Sample | Dielectric (Å) | Buffer Layer Dielectric (Å) | Ave Mob | Std Mob | Ave Vth | Std Vth | Ave Ion/Ioff | Av Ig(Vgmax) | % Yield |
|---|---|---|---|---|---|---|---|---|---|
| C4 | 750 | 0 | 2.77 | 2.41 | 10.66 | 1.80 | 4.09E+04 | 6.3E−11 | 34 |
| I13 | 500 | 250 | 10.19 | 0.39 | 9.74 | 0.20 | 4.82E+05 | 1.5E−10 | 58 |
| I14 | 250 + 250 | 250 | 11.43 | 0.42 | 9.43 | 0.16 | 5.29E+05 | 1.5E−10 | 84 |

Inventive Example I17

TFT with Single Layer Dielectric and Buffer Layer on a Glass Substrate

Inventive example I16, was prepared as inventive example I16 with the following exceptions. After deposition of the third dielectric layer (the buffer layer), the sample was subjected to a 2 minute $O_2$ plasma treatment to remove the inhibitor and clean the interface. Next, the inhibitor semiconductor pattern was printed again and 300 Å of N-doped ZnO was deposited at 200° C., using the conditions listed for ZnO:N in Table 1 and 30 ALD cycles each with a 50 ms residence time. The sample was then completed as comparative example C4 and analyzed. The results of this testing can be found in Table 7.

TABLE 7

| Sample | Dielectric (Å) | Buffer Layer Dielectric (Å) | Ave Mob | Std Mob | Ave Vth | Std Vth | Ave Ion/Ioff | Av Ig(Vgmax) | % Yield |
|---|---|---|---|---|---|---|---|---|---|
| C5  | 750       | 0    | 3.15  | 3.40 | 10.92 | 2.07 | 8.02E+04 | 2.3E−05 | 57  |
| I15 | 500       | 250  | 10.46 | 1.87 | 8.88  | 0.87 | 5.35E+05 | 1.0E−04 | 34  |
| C6  | 500       | 250* | 3.25  | 3.70 | 10.94 | 2.07 | 8.14E+04 | 1.5E−05 | 36  |
| I16 | 250 + 250 | 250  | 11.04 | 0.35 | 9.53  | 0.10 | 5.11E+05 | 2.4E−10 | 99  |
| I17 | 250 + 250 | 250* | 2.59  | 0.54 | 10.95 | 0.50 | 5.94E+04 | 6.2E−10 | 100 |

*I15 and I16 received 2 minute $O_2$ plasma after buffer layer deposition

As can be seen in Table 7, inventive samples I15 and I16 have significantly higher average mobility values than the comparative examples C4 and C6. This higher mobility can be attributed to the care taken at the interface of the semiconductor and dielectric. In these inventive examples (I15 and I16) the semiconductor and third dielectric layer (buffer layer) were patterned using the same patterned director inhibitor material alleviating the need to clean the sample surface prior to the deposition of the semiconductor. Inventive example I15 and comparative example C6 are structurally the same. The deleterious impact of cleaning the dielectric surface prior to depositing the dielectric layer can be seen by the lower mobility measured in C6. Inventive examples I16 and I17 exhibit significantly higher yield than C5 and C6. This can be attributed to the robustness of the multilayer dielectric stack.

PARTS LIST 1 providing a substrate
10 applying the deposition inhibitor material
15 optionally patterning the deposition inhibitor material
20 ALD
22 ALD
25 simultaneously treating
30 treating the surface
35 applying the deposition inhibitor material
40 optionally patterning the deposition inhibitor material
50 ALD
52 ALD
60 removing the deposition inhibitor material
81 nitrogen gas flow
82, 83, 84 gas bubbler
85, 86 flow meter
87, 88 flow meter
89, 91, 94 flow meter
90 air flow
92 metal precursor flow
93 oxidizer-containing flow
95 nitrogen purge flow
96 substrate support
97 example substrate
98 arrow
99 gap
100 delivery head
105 output face
110 exhaust channels
200 substrate
210 first patterned deposition inhibiting material layer
215 region where the first deposition inhibiting material layer is not present
220 patterned first inorganic thin film dielectric material
225 partially removed first patterned deposition inhibiting material layer
230 second patterned deposition inhibiting material layer
235 region where the second deposition inhibiting material layer is not present
240 patterned second inorganic thin film dielectric material
250 patterned inorganic thin film dielectric stack
300 substrate
310 patterned deposition inhibiting material layer
315 region where the deposition inhibiting material layer is not present
320 patterned first inorganic thin film material
330 patterned second inorganic thin film material
350 inorganic multi-layered thin film structure
400 substrate
410 patterned first electrically conductive
420 patterned second electrically conductive
425 overlap region
430 patterned first inorganic thin film dielectric material
440 patterned second inorganic thin film dielectric material
450 patterned inorganic thin film dielectric stack
460 patterned first inorganic thin film dielectric material
465 patterned first inorganic thin film dielectric material
470 patterned second inorganic thin film dielectric material
475 patterned second inorganic thin film dielectric material
500 transistor
505 transistor
510 substrate
520 gate
530 patterned first inorganic thin film dielectric layer
540 patterned second inorganic thin film dielectric layer
550 patterned inorganic thin film dielectric stack
560 patterned third inorganic thin film dielectric layer
570 patterned semiconductor layer
580 source/drain
600 transistor
610 substrate 620 gate
630 patterned first inorganic thin film dielectric layer
660 patterned second inorganic thin film dielectric layer
670 patterned semiconductor layer
680 source/drain
700 transistor
710 substrate
720 gate
730 patterned first inorganic thin film dielectric layer
740 patterned second inorganic thin film dielectric layer
750 patterned inorganic thin film dielectric stack
770 patterned semiconductor layer
780 source/drain
810 first patterned deposition inhibiting material layer
820 region where the deposition inhibiting material layer is not present
830 second patterned deposition inhibiting material layer
840 region where the deposition inhibiting material layer is not present
850 third patterned deposition inhibiting material layer
860 region where the deposition inhibiting material layer is not present
870 fourth patterned deposition inhibiting material layer
880 region where the deposition inhibiting material layer is not present

The invention claimed is:

1. A method of producing an inorganic thin film dielectric material layer comprising:
   providing a substrate;
   depositing a first inorganic thin film dielectric material layer on the substrate using an atomic layer deposition process within an atomic layer deposition (ALD) system;
   forming an interface region on the first inorganic thin film dielectric layer prior to selectively depositing a second inorganic thin film dielectric material layer by treating the first inorganic thin film dielectric material layer after its deposition by at least removing the substrate from the ALD system to a different environmental condition than that experienced in the ALD system;
   providing a patterned deposition inhibiting material layer on the substrate; and
   selectively depositing the second inorganic thin film dielectric material layer on a region of the substrate where the deposition inhibiting material layer is not present using an atomic layer deposition process within the ALD system, wherein the first inorganic thin film dielectric material layer and the second inorganic thin film dielectric material layer have the same material composition.

2. The method of claim 1, wherein providing the patterned deposition inhibiting material layer on the substrate includes using at least one of an inkjet printing process, a flexographic printing process, a gravure printing process, and a photolithographic printing process.

3. The method of claim 1, wherein the substrate includes a plurality of material layers.

4. The method of claim 1, wherein treating the first inorganic thin film dielectric material layer after its deposition includes subjecting the first inorganic thin film dielectric material layer to a plasma process.

5. The method of claim 4, wherein the plasma process in an oxygen plasma process.

6. The method of claim 1, wherein treating the first inorganic thin film dielectric material layer after its deposition includes subjecting the first inorganic thin film dielectric material layer to an etching process.

7. The method of claim 1, wherein treating the first inorganic thin film dielectric material layer after its deposition includes subjecting the first inorganic thin film dielectric material layer to a wet cleaning process.

8. The method of claim 1, wherein the deposition inhibiting material layer includes one of a self assembled monolayer, a polymer, and a water soluble polymer.

9. The method of claim 1, wherein at least one of the first inorganic thin film dielectric material layer and the second inorganic thin film dielectric material layer include one of a $Al_2O_3$, $SiO_2$, HfO, ZrO, $TiO_2$, $Ta_2O_5$, and $Si_xN_y$ material.

10. The method of claim 1, wherein the first inorganic thin film dielectric material layer and the second inorganic thin film dielectric material layer have the same thickness.

11. The method of claim 1, wherein forming the interface region on the first inorganic thin film dielectric layer modifies a chemical composition of at least a portion of the interface region between the first and second inorganic thin film dielectric material layers.

* * * * *